US012236164B2

(12) United States Patent
McCarty et al.

(10) Patent No.: US 12,236,164 B2
(45) Date of Patent: *Feb. 25, 2025

(54) SYSTEMS AND METHODS FOR GENERATING A VOLUME-BASED RESPONSE FOR MULTIPLE VOICE-OPERATED USER DEVICES

(71) Applicant: Adeia Guides Inc., San Jose, CA (US)

(72) Inventors: Michael McCarty, Aguora Hills, CA (US); Glen E. Roe, Simi Valley, CA (US)

(73) Assignee: Adeia Guides Inc., San Jose, CA (US)

( * ) Notice: Subject to any disclaimer, the term of this patent is extended or adjusted under 35 U.S.C. 154(b) by 216 days.

This patent is subject to a terminal disclaimer.

(21) Appl. No.: 17/947,650

(22) Filed: Sep. 19, 2022

(65) Prior Publication Data
US 2023/0013021 A1 Jan. 19, 2023

Related U.S. Application Data

(63) Continuation of application No. 16/738,815, filed on Jan. 9, 2020, now Pat. No. 11,481,187, which is a
(Continued)

(51) Int. Cl.
*G06F 3/16* (2006.01)
*G10L 13/033* (2013.01)
(Continued)

(52) U.S. Cl.
CPC ............. *G06F 3/167* (2013.01); *G06F 3/165* (2013.01); *G10L 13/033* (2013.01); *G10L 15/22* (2013.01);
(Continued)

(58) Field of Classification Search
CPC ....... G06F 3/167; G06F 3/165; G10L 13/033; G10L 15/22; G10L 21/034; G10L 25/21;
(Continued)

(56) References Cited

U.S. PATENT DOCUMENTS 5,657,425 A 8/1997 Johnson
6,239,794 B1 5/2001 Yuen et al.
(Continued)

FOREIGN PATENT DOCUMENTS

CA 3015491 A1 8/2017
JP 2000194386 A 7/2000
(Continued)

*Primary Examiner* — Brian L Albertalli
(74) *Attorney, Agent, or Firm* — Haley Guiliano LLP

(57) ABSTRACT

Systems and methods are provided herein for responding to a voice command at a volume level based on a volume level of the voice command. For example, a media guidance application may detect, through a first voice-operated user device of a plurality of voice-operated user devices, a voice command spoken by a user. The media guidance application may determine a first volume level of the voice command. Based on the volume level of the voice command, the media guidance application may determine that a second voice-operated user device of the plurality of voice-operated user devices is closer to the user than any of the other voice-operated user devices. The media guidance application may generate an audible response, through the second voice-operated user device, at a second volume level that is set based on the first volume level of the voice command.

20 Claims, 9 Drawing Sheets

Related U.S. Application Data continuation of application No. 15/612,516, filed on Jun. 2, 2017, now Pat. No. 10,564,928.

(51) Int. Cl.
| | |
|---|---|
| *G10L 15/22* | (2006.01) |
| *G10L 21/034* | (2013.01) |
| *G10L 21/10* | (2013.01) |
| *G10L 25/21* | (2013.01) |
| *H03G 3/30* | (2006.01) |
| *H03G 3/32* | (2006.01) |
| *H04L 12/28* | (2006.01) |

(52) U.S. Cl.
CPC ............ *G10L 21/034* (2013.01); *G10L 25/21* (2013.01); *H03G 3/3005* (2013.01); *H03G 3/32* (2013.01); *H04L 12/282* (2013.01); *G10L 21/10* (2013.01); *H04L 2012/2849* (2013.01)

(58) Field of Classification Search
CPC ........ G10L 21/10; H03G 3/3005; H03G 3/32; H04L 12/282
See application file for complete search history.

(56) References Cited

U.S. PATENT DOCUMENTS

| | | | |
|---|---|---|---|
| 6,564,378 | B1 | 5/2003 | Satterfield et al. |
| 7,165,098 | B1 | 1/2007 | Boyer et al. |
| 7,761,892 | B2 | 7/2010 | Ellis et al. |
| 8,046,801 | B2 | 10/2011 | Ellis et al. |
| 9,749,583 | B1 | 8/2017 | Fineberg et al. |
| 9,830,924 | B1 | 11/2017 | Degges et al. |
| 10,089,072 | B2 | 10/2018 | Piersol et al. |
| 10,147,439 | B1 | 12/2018 | Kristjansson et al. |
| 10,621,980 | B2 | 4/2020 | Kim |
| 2002/0174430 | A1 | 11/2002 | Ellis et al. |
| 2005/0165609 | A1 | 7/2005 | Zuberec et al. |
| 2005/0251827 | A1 | 11/2005 | Ellis et al. |
| 2006/0085183 | A1 | 4/2006 | Jain |
| 2009/0063141 | A1 | 3/2009 | Huang |
| 2009/0157388 | A1 | 6/2009 | Boeckmann et al. |
| 2010/0153885 | A1 | 6/2010 | Yates |
| 2011/0044474 | A1 | 2/2011 | Grover et al. |
| 2012/0230516 | A1 | 9/2012 | Wong et al. |
| 2013/0290002 | A1 | 10/2013 | Togawa et al. |
| 2014/0372109 | A1 | 12/2014 | Iyer |
| 2014/0379343 | A1 | 12/2014 | Karimi-Cherkandi et al. |
| 2015/0310865 | A1 | 10/2015 | Fay et al. |
| 2016/0011665 | A1 | 1/2016 | Arnold et al. |
| 2017/0133011 | A1 | 5/2017 | Chen et al. |
| 2017/0221336 | A1 | 8/2017 | Ogaz |
| 2017/0242651 | A1 | 8/2017 | Lang et al. |
| 2017/0289676 | A1 | 10/2017 | Stewart et al. |
| 2017/0330566 | A1 | 11/2017 | Trott et al. |
| 2018/0033424 | A1* | 2/2018 | Pechanec ............ G10L 21/0364 |
| 2018/0107445 | A1 | 4/2018 | Ohmura |
| 2018/0233144 | A1 | 8/2018 | Yuan |
| 2018/0308324 | A1 | 10/2018 | Mixter et al. |
| 2020/0075036 | A1* | 3/2020 | Shin ........................ G10L 25/78 |

FOREIGN PATENT DOCUMENTS

| | | |
|---|---|---|
| JP | 2002182688 A | 6/2002 |
| JP | 2002351653 A | 12/2002 |
| JP | 2007025140 A | 2/2007 |
| JP | 2010152119 A | 7/2010 |
| WO | 2017053311 A1 | 3/2017 |
| WO | 2017147075 A1 | 8/2017 |

* cited by examiner

SYSTEMS AND METHODS FOR GENERATING A VOLUME-BASED RESPONSE FOR MULTIPLE VOICE-OPERATED USER DEVICES

CROSS-REFERENCE TO RELATED APPLICATION

This application is a continuation of U.S. patent application Ser. No. 16/738,815, filed Jan. 9, 2020, which is a continuation of U.S. patent application Ser. No. 15/612,516, filed Jun. 2, 2017, now U.S. Pat. No. 10,564,928, the contents of which are hereby incorporated by reference herein in their entireties.

BACKGROUND

It has become increasingly common for homes to contain voice-operated user devices. Voice-operated devices can tailor their response volumes to the volume of a user's voice command. However, with multiple voice-operated user devices in one home becoming more and more common, it becomes increasingly difficult to coordinate between multiple devices when determining which device should respond to a query and at what volume. Furthermore, matching the response volume to the volume of the user's voice, may, in some circumstances, prevent the user from hearing the response. Manually choosing a device and setting a response volume each time a user wants a response to a voice command may be cumbersome to the user and ultimately make the device response less useful.

SUMMARY

Accordingly, systems and methods are described herein for responding to a voice command at a volume level based on a volume level of the voice command. Using the volume level of a voice command to determine a response volume level allows users to, for example, change the response volume level without having to manually adjust the voice-operated user device. As one example, there may be a first voice-operated user device on one end of a couch and a second voice-operated user device on the opposite end of the couch. A first user may sit at the end of the couch nearest the first device while a second user may sit at the opposite end of the couch nearest the second voice-operated user device. The first user may utter a voice command that is received by both the first and second voice-operated user devices. The systems and methods described herein may determine, based on the voice command volume level received at each voice-operated user device, that the first voice-operated user device is nearer to the user. The first voice-operated user device may then respond at a volume level based on the volume level of the voice command. For example, the first user and the second user may be watching a movie (e.g., "Star Wars"). The first user's voice command may be a whispered request to repeat the last line said in the movie (e.g., "May the Force be with you"). The first voice-operated user device may respond by whispering the last line (e.g., "May the Force be with you") back to the user.

These systems and methods may be implemented by a media guidance application. The media guidance application may be connected to a plurality of voice-operated user devices. The plurality of voice-operated user devices may include, for example, DeviceA, DeviceB, and DeviceC. The media guidance application may detect, through a first voice-operated user device of the plurality of voice-operated user devices, a voice command spoken by a user. For example, the media guidance application may detect, through DeviceA, a voice command from the user saying "Repeat the last line", in reference to a movie the user is currently watching.

The media guidance application may determine a first volume level of the voice command, wherein the voice command is received by the first voice-operated user device. For example, the first volume level may be the average of input volume (e.g., 48 db) of the voice command detected at the first voice-operated user device (e.g., DeviceA).

In some embodiments, in order to determine the first volume level, the media guidance application may measure an unfiltered volume level of the voice command. For example, the unfiltered volume level of the voice command may be 60 dB. This unfiltered volume level, however, may include a level of background noise, such as a television audibly playing a movie near the user. The media guidance application may determine a level of background noise and may filter the voice command to remove the level of background noise. For example, the movie playing on the television may be at a higher frequency than the voice of the user. The media guidance application may filter out the high frequency components of the voice command to remove the background noise. The media guidance application may then calculate a filtered volume level of the voice command. For example, the filtered volume level of the voice command may be 48 dB, compared to the unfiltered volume level 60 dB.

Several voice-operated user devices may detect the voice command from the user. Each of these devices could receive the voice command at a different volume level, depending on, for example, proximity to the user. Therefore, each voice-operated user device of a plurality of voice-operated user devices will be associated with a volume level of a plurality of volume levels of the voice command. The media guidance application may receive at least one data structure associating each volume level of the plurality of volume levels with a respective voice-operated user device of the plurality of voice-operated user devices. For example, the media guidance application may receive, from each voice-operated user device of the plurality of voice-operated user devices, a data structure containing a volume level and a voice-operated user device identifier for the respective voice-operated user device. For example, the media guidance application may receive from a second voice-operated user device a data structure containing a volume level of 52 db and a device identifier DeviceB. For example, the media guidance application may receive from a third voice-operated user device a data structure containing a volume level of 50 db and a device identifier DeviceC.

In some embodiments, the media guidance application may compare the first volume level to the plurality of volume levels. For example, the media guidance application may compare 48 dB associated with DeviceA to 52 dB associated with DeviceB to 50 dB associated with DeviceC.

In some embodiments, the media guidance application may determine, based on comparing the first volume level to the plurality of volume levels, a greatest volume level of the plurality of volume levels. For example, the greatest volume level received by any of the plurality of voice-operated user devices may be 52 dB. The greatest volume level of the plurality of volume levels is the loudest of the volume levels received by the plurality of voice-operated user devices.

In some embodiments, the media guidance application may search the at least one data structure for a second voice-operated user device associated with the greatest volume level. The user device associated with the greatest volume will be the device nearest to the user who issued the voice command, because the closer a device is to a user, the louder a voice command from that user will sound to the device. For example, if the greatest volume level is 52 dB, the media guidance application may search the data structure to find the voice-operated user device associated with 52 dB volume level. In the data structure, the 52 dB volume level may be associated with device identifier DeviceB, which represents the second voice-operated user device. DeviceB, in this example, is the nearest voice-operated user device to the user.

In some embodiments, the media guidance application may transmit a command to the second voice-operated user device. The command may instruct the second voice-operated user device to update a response level to a second volume level that is based on the greatest volume level. For example, the media guidance application may instruct the second voice-operated user device identified as DeviceB to change the response level to volume level 52 dB. For example, the media guidance application may instead instruct the second voice-operated user device identified as DeviceB to change the response level to 53 dB, which is slightly louder than the greatest volume level. The media guidance application may slightly increase the greatest volume level to determine the second volume in this manner to account for ambient noise.

In some embodiments, the media guidance application may generate an audible response to the voice command. The audible response may be generated through the second voice-operated user device, at the second volume level. For example, the second voice-operated user device identified as DeviceB may repeat at volume level 53 dB the last line of the movie the user is currently watching (e.g., "May the Force be with you"). In some embodiments, the first and second voice-operated user devices may be the same device and the first volume level and the second volume may be the same volume level.

In some embodiments, the media guidance application may determine that the voice-operated user devices (e.g., DeviceA, DeviceB, DeviceC) do not use the same equipment, method, or sensitivity to detect the voice command. Therefore, the greatest volume level detected may not correspond to the voice-operated user device nearest the user issuing the voice command. In some embodiments, the media guidance application may account for this difference in voice-operated user devices when determining the greatest volume level and adjust the plurality of volume levels accordingly, prior to determining the greatest volume level. In some embodiments, the media guidance application may use other factors to determine the closest voice-operated user device. These factors may include, for example, infrared (IR) detection to measure the space between each voice-operated user device and the user issuing the voice command.

In some embodiments, the media guidance application may determine users other than the user who issued the voice command who would be interested in hearing the audible response to the voice command. In such embodiments, more than one voice-operated user device of the plurality of voice-operated user devices may output the audible response. These responses may be given simultaneously and optionally at different volumes, so that each of the determined users is able to hear the response. For example, UserA may issue a voice command asking what television show is currently being broadcast on television channel HBO. The media guidance application may determine that the program is "Game of Thrones." The media guidance application may determine that a second user, UserB, has an interest in the program "Game of Thrones." When the media guidance application generates the audible response (e.g., "Game of Thrones is currently playing on HBO.") to the voice command from UserA through the second voice-operated user device, the media guidance application may further generate the audible response through a third voice-operated user device near UserB. The audible response generated through the second voice-operated user device may be generated at, for example, a second volume level 53 dB, while the audible response generated through the third voice-operated user device may be generated at, for example, a third volume level 55 dB. The second and third volume levels may be chosen based on, for example, how well the respective user will be able to hear the audible response.

To determine the second volume level, in some embodiments, the media guidance application may identify a user profile associated with the user. The user profile may contain a hearing information data structure containing a plurality of user volume levels that the user has acknowledged hearing in the past. The media guidance application may determine a lowest user volume level of the plurality of user volume levels. For example, the lowest volume level a user has previously acknowledged hearing may be 40 dB. The second volume level (the volume level of the audible response) may be further based on the lowest user volume level. For example, the greatest volume level heard by any of the plurality of user devices (such as DeviceA, DeviceB, or DeviceC) may be 35 dB. In this example, the second volume level would be set at 40 dB to ensure that the user is capable of hearing the audible response.

In some embodiments, the response to the voice command from the user may be visually displayed on a device. The media guidance application may identify a display device associated with the user. For example, the media guidance application may interface with a television associated with the user through a user profile. The media guidance application may generate for display a visual representation of the audible response. For example, the media guidance application may generate a window on the television and may display the response in the window. For example, the media guidance application may display the title of the program "Game of Thrones" when the request from the user that is received is a query about the name of the show. Furthermore, after the audible response is generated, the display window may include a reference to the device that gave the audible response. For example, the media guidance application may display "DeviceB said '"Game of Thrones."'" This informs the user what device they are communicating with and, therefore, what device is near to them.

In some embodiments, the media guidance application may determine, using the user profile, that the user is hearing impaired. For example, this information could be stored in the hearing information data structure. For example, the user may not be able to hear any audible response. In this case, similar to the description above, the media guidance application may identify a display device associated with the user. The media guidance application may generate for display a visual representation of the audible response and transmit the visual representation to the display device. For example, the media guidance application may transmit the visual representation to a mobile phone associated with the user.

In some embodiments, the media guidance application may wait a period of time for an acknowledgement that the user has heard the audible response. If an acknowledgement is not received in that time, the media guidance application may generate a second audible response to the voice command through the second voice-operated user device or may generate display a visual representation of the audible response to display on a user device. To accomplish this, a media guidance application may determine a first time corresponding to when the audible response was generated. For example, when the audible response is generated, the media guidance application may save a time stamp to a data structure. For example, the audible response may have been generated at 3:12:03 PM. The media guidance application may then calculate a second time by adding a time period to the first time. For example, the time period may be 20 seconds and the second time may be 3:12:23 PM. This time period represents how long the media guidance application waits before again responding to the user's voice command.

The time period for waiting for a user acknowledgement can be determined in a variety of ways. In some embodiments, the media guidance application may determine the time period by identifying a user profile associated with the user and determining, using the user profile, an average time for response. For instance, the user profile may be identified by the media guidance application by receiving a key word spoken by the user, wherein the key word is associated with the specific user. The user profile may also be identified by the speech patterns of the user. The user profile may contain, for example, a first data structure containing amounts of time it has taken for the user to respond to the voice-operated user device in the past. The media guidance application may calculate the average of these past response times to determine the average time for a response for the user. For example, the user may have taken 10 seconds, 5 seconds, and 15 seconds to respond to the second voice-operated user device in the past. The time period to wait for a response could be set to 10 seconds for this user, because 10 seconds is the average of the user's past response times.

In some embodiments, if the voice-operated user device does not receive an acknowledgement from the user within the time period, the media guidance application will generate another response or repeat the original audible response to the voice command. The acknowledgement indicates the audible response was heard by the user. For example, the audible response from the second voice-operated user device, such as DeviceB, may be "May the Force be with you." The user may acknowledge this response by saying "Thanks, DeviceB."

If no acknowledgement is received in a time period, a second audible response or a visual representation of the audible response may be generated. For example, in some embodiments, the media guidance application may transmit, based on whether an acknowledgement was received at a third time, a visual representation of the audio response to the display device associated with the user, wherein the third time is before the second time. For example, the audible response may have been generated at 3:12:03 PM. If the time period is 20 seconds, for example, the second time is 3:12:23 PM. If DeviceB has not received an acknowledgement by 3:12:23 PM, the media guidance application may generate, through the television associated with the user, the visual representation of the audible response (e.g., "DeviceB said '"May the Force be with you"'").

In some embodiments, if the voice-operated user device does not receive an acknowledgement from the user within the time period, the media guidance application generates another audible response. Specifically, the media guidance application may generate, based on whether an acknowledgement was received at a third time, a second audible response through the second voice-operated user device. The second audible response can be the same as the audible response, in which case the second user simply repeats the audible response to the user at the same or a different volume level. The second audible response may also, for example, prompt the user to respond. For example, if DeviceB has not received an acknowledgement from the user by 3:12:23 PM, the media guidance application may generate through DeviceB the second audible response asking, "Did you hear '"May the Force be with you"'?"

The second audible response may be generated at the same volume level as the first response or, in some embodiments, at a louder volume level. For example, the media guidance application may determine a third volume level that is greater than the second volume at which to generate the second audible response. The third volume level might be, for example, the second volume level plus a predetermined amount. For example, the second volume level could be 53 dB, while the third volume level could be 56 dB. Because the second audible response is generated at the third volume level, the media guidance application may generate the second audible response (e.g., "Did you hear '"May the Force be with you"'?") through DeviceB at 56 dB.

In some aspects, in order to best generate the second audible response, the media guidance application may identify a user profile associated with the user. For instance, the media guidance application may identify the user profile by receiving a key word spoken by the user. UserA may, for example, say "UserA" before issuing a voice command. The user profile may also be identified, for example, by the speech or vocal patterns of the user.

In some embodiments, the media guidance application may use the user profile to identify an average speaking volume associated with the user. For instance, the user profile may contain a first data structure containing speaking volumes the user has used in the past. The media guidance application may calculate the average of these past speaking volumes to determine the average speaking volume for the user. For example, the average speaking volume of the user may be 60 dB.

The media guidance application may then determine a difference between the average speaking volume level and the greatest volume level (i.e. the volume level received by the voice-operated user device nearest the user). For example, the greatest volume level may be 52 dB and the average speaking volume of the user may be 60 dB. The difference, in this case, is 8 dB.

The third volume level (the volume level of the second audible response) may be based on the difference added to the second volume level. For example, the second volume level may be 53 dB, the difference may be 8 dB, and the third volume may be 61 dB. In this case, the second voice-operated user device would issue the second audible response at 61 dB.

In some examples, the media guidance application receives an acknowledgement from the user. In response to receiving the acknowledgement, the media guidance application may store the second volume level (the volume level of the original audible response) in the user's user profile. For instance, the user profile may contain a hearing information data structure containing a plurality of user volume levels the user has been able to hear in the past. The second volume level may be stored in this second data structure.

It should be noted the systems and/or methods described above may be applied to, or used in accordance with, other systems, methods and/or apparatuses described in this disclosure.

BRIEF DESCRIPTION OF THE DRAWINGS

The above and other objects and advantages of the disclosure will be apparent upon consideration of the following detailed description, taken in conjunction with the accompanying drawings, in which like reference characters refer to like parts throughout, and in which.

DETAILED DESCRIPTION

Systems and methods are described herein for responding to a voice command at a volume level based on a volume level of the voice command. Using the volume level of the voice command to determine a response volume level allows users to, for example, change the response volume level without having to manually adjust the voice-operated user device.

Figure 1:
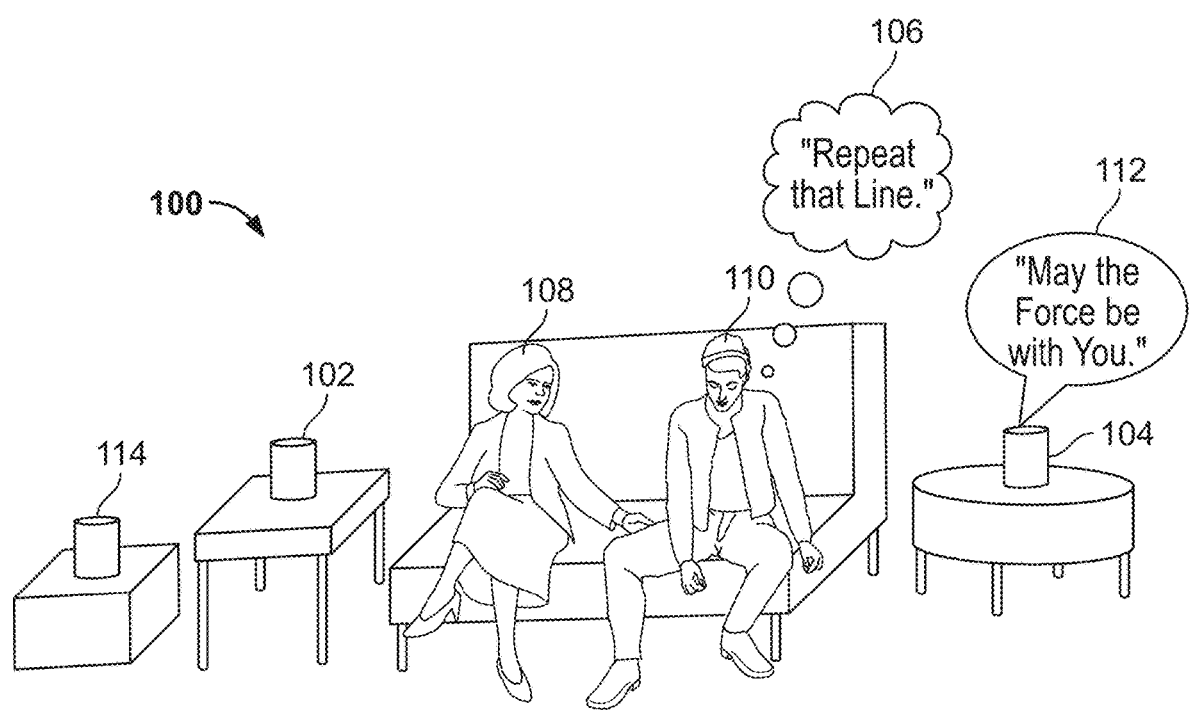
FIG. 1 shows an illustrative example of multiple voice-operated user devices detecting a voice command, in accordance with some embodiments of the disclosure.

FIG. 1 shows an illustrative example of multiple voice-operated user devices detecting a voice command, in accordance with some embodiments of the disclosure. There may be a first voice-operated user device 102 on one end of a couch and a second voice-operated user device 104 on the opposite end of the couch. A first user 108 may sit at the end of the couch nearest the first device 102 while a second user 110 may sit at the opposite end of the couch nearest the second voice-operated user device 104. The second user 110 may utter a voice command 106 that is received by both the first voice-operated user device 102 and the second voice-operated user device 104. The systems and methods described herein may determine, based on the voice command volume level received at each voice-operated user device 102, 104, that the second voice-operated user device 104 is nearer to the second user 110 who issued the voice command 106. The second voice-operated user device 104 may then respond 112 at a volume level based on the volume level of the voice command 106. For example, the first user 108 and the second user 110 may be watching a movie (e.g., "Star Wars"). The second user's 110 voice command 106 may be a whispered request to repeat the last line said in the movie (e.g., "May the Force be with you"). The second voice-operated user device 104 may respond 112 by whispering the last line (e.g., "May the Force be with you") back to the second user 110. Therefore, although the first voice-operated user device 102 received the voice command 106, the second voice-operated user device 104 provided the response 112.

These systems and methods may be implemented by a media guidance application. The media guidance application may be connected to a plurality of voice-operated user devices 102, 104, 114. The plurality of voice-operated user devices may include, for example, a first voice-operated user device 102 (e.g., DeviceA), a second voice-operated user device 104 (e.g., DeviceB), and a third voice-operated user device 114 (e.g., DeviceC). The media guidance application may detect, through a first voice-operated user device 102 of the plurality of voice-operated user devices, a voice command 106 spoken by a user. For example, the media guidance application may detect, through the first voice-operated user device 102 (e.g., DeviceA), a voice command 106 from the user saying "Repeat the last line," in reference to a movie the user is currently watching.

The media guidance application may determine a first volume level of the voice command 106, wherein the voice command is received by the first voice-operated user device 102. For example, the first volume level may be the average of the input volume (e.g., 48 db) of the voice command 106 detected at the first voice-operated user device 102 (e.g., DeviceA).

In some embodiments, in order to determine the first volume level, the media guidance application may measure an unfiltered volume level of the voice command 106. For example, the unfiltered volume level of the voice command may be 60 dB. This unfiltered volume level, however, may include a level of background noise, such as a television audibly playing a movie near the user 110.

The media guidance application may determine a level of background noise and may filter the voice command 106 to remove the level of background noise. For example, the movie playing on the television may be at a higher frequency than the voice of the user 110. The media guidance application may filter out the high frequency components of the voice command 106 to remove the background noise. The media guidance application may then calculate a filtered volume level of the voice command 106. For example, the filtered volume level of the voice command may be 48 dB, compared to the unfiltered volume level 60 dB.

Several voice-operated user devices (e.g., DeviceA 102, DeviceB 104, and DeviceC 114) may detect the voice command 106 from the user. Each of these devices 102, 104, 114 may receive the voice command at a different volume level, depending on, for example, proximity to the user 110 issuing the voice command 106. Therefore, each voice-operated user device 102, 104, 114 of a plurality of voice-operated user devices will be associated with a volume level of a plurality of volume levels of the voice command 106. The media guidance application may receive at least one data structure associating each volume level of the plurality of volume levels with a respective voice-operated user device of the plurality of voice-operated user devices. For example, the media guidance application may receive, from each voice-operated user device of the plurality of voice-operated user devices, a data structure containing a volume level and a voice-operated user device identifier for the respective voice-operated user device. For example, the media guidance application may receive from a second voice-operated user device 104 a data structure containing a volume level of 52 db and a device identifier DeviceB. For example, the media guidance application may receive from the third voice-operated user device 114 a data structure containing a volume level of 50 db and a device identifier DeviceC.

In some embodiments, the media guidance application may compare the first volume level to the plurality of volume levels. For example, the media guidance application may compare 48 dB associated with DeviceA 102 to 52 dB associated with DeviceB 104 to 50 dB associated with DeviceC 114.

In some embodiments, the media guidance application may determine, based on comparing the first volume level to the plurality of volume levels, a greatest volume level of the plurality of volume levels. For example, the greatest volume level received by any of the plurality of voice-operated user devices may be 52 dB. The greatest volume level of the plurality of volume levels is the loudest of the volume levels received by the plurality of voice-operated user devices (e.g., of voice-operated user devices 102, 104, 114).

In some embodiments, the media guidance application may search the at least one data structure for a second voice-operated user device 104 associated with the greatest volume level. The user device associated with the greatest volume will be the device nearest to the user who issued the voice command, because the closer a device is to a user, the louder a voice command from that user will sound to the device. For example, if the greatest volume level is 52 dB, the media guidance application may search the data structure to find the voice-operated user device associated with 52 dB volume level. In the data structure, the 52 dB volume level may be associated with device identifier DeviceB, which represents the second voice-operated user device 104. The second voice-operated user device 104 (e.g., DeviceB), in this example, is the nearest voice-operated user device to the user 110 who issued voice command 106.

In some embodiments, the media guidance application may transmit a command to the second voice-operated user device 104. The command may instruct the second voice-operated user device 104 to update a response level to a second volume level that is based on the greatest volume level. For example, the media guidance application may instruct the second voice-operated user device 104 identified as DeviceB to change the response level to volume level 52 dB. For example, the media guidance application may instead instruct the second voice-operated user device 104 identified as DeviceB to change the response level to 53 dB, which is slightly louder than the greatest volume level. The media guidance application may slightly increase the greatest volume level to determine the second volume in this manner to account for ambient noise.

In some embodiments, the media guidance application may generate an audible response 112 to the voice command 106. The audible response 112 may be generated through the second voice-operated user device 104, at the second volume level. For example, the second voice-operated user device 104 identified as DeviceB may repeat at volume level 53 dB the last line of the movie the user is currently watching (e.g., "May the Force be with you"). In some embodiments, the first voice-operated device and the second voice-operated user device may be the same device and the first volume level and the second volume may be the same volume level.

In some embodiments, the media guidance application may determine that the voice-operated user devices (e.g., first voice-operated user device 102, second voice-operated user device 104, third voice-operated user device 114) do not use the same equipment, method, or sensitivity to detect the voice command 106. Therefore, the greatest volume level detected may not correspond to the voice-operated user device nearest the user 110 issuing the voice command 106. In some embodiments, the media guidance application may account for this difference in voice-operated user devices when determining the greatest volume level and adjust the plurality of volume levels accordingly. In some embodiments, the media guidance application may use other factors to determine the closest voice-operated user device. These factors may include, for example, infrared (IR) detection to measure the space between each voice-operated user device and the user issuing the voice command.

In some embodiments, the media guidance application may determine users other than the user 110 who issued the voice command 106 who would be interested in hearing the audible response 112 to the voice command 106. In such embodiments, more than one voice-operated user device of the plurality of voice-operated user devices 102, 104, 114 may output the audible response. These responses may be given simultaneously and optionally at different volumes, so that each of the determined users is able to hear the response. For example, the second user 110 may issue a voice command asking what television show is currently being broadcast on television channel HBO. The media guidance application may determine that the program is "Game of Thrones". The media guidance application may determine that the first user 108 has an interest in the program "Game of Thrones". When the media guidance application generates the audible response (e.g., "Game of Thrones is currently playing on HBO.") to the voice command from the second user 110 through the second voice-operated user device 104, the media guidance application may further generate the audible response through a third voice-operated user device 114 near the user 108. The audible response generated through the second voice-operated user device 104 may be generated at, for example, a second volume level 53 dB, while the audible response generated through the third voice-operated user device 114 may be generated at, for example, a third volume level 55 dB. The second and third volume levels may be chosen based on, for example, how well the respective user will be able to hear the audible response.

In some embodiments, the media guidance application may determine a user is moving. For example, the media guidance application may measure the volume level of the voice command when the user begins speaking and when the user ends speaking. The volume level received at the third voice operated user device 114 when the user begins issuing the voice command may be greater than the volume level received at the third voice operated user device 114 when the user finishes issuing the voice command. The volume level received at the second voice operated user device 104 when the user begins speaking may be softer than the volume level received at the second voice operated user device 104 when the user ends speaking. The media guidance application may determine, using these changing received volume levels, that the user is moving from near the third voice operated user device to nearer the second voice operated user device. The media guidance application may accordingly determine multiple voice operated user devices of the plurality of voice operated user devices along the user's path of movement.

In some embodiments, the media guidance application may generate components of the audible response through the multiple voice operated user devices of the plurality of voice operated user devices. The multiple voice operated user devices may generate the audible response or a component of the audible response simultaneously or at different times. For example, the voice command may request a translation of a song from Spanish to English. The third voice operated user device 114 may play the first ten seconds of the translated song (the audible response), the first voice operated user device 102 may play the next ten seconds of the song, and the second voice operated user device may play the remaining component of the song. The media guidance application may adjust the response volume of each of the multiple devices to be the same (e.g., the second volume level) and respond at this same volume level from all devices. For example, the second volume level may be 57 dB. Each of the multiple voice operated user devices may respond at the second volume level 57 dB. In the above described embodiment, the audible response may therefore follow along the user's path of movement, allowing the user to better hear the audible response as he or she moves near different devices.

To determine the second volume level, in some embodiments, the media guidance application may identify a user profile associated with the user 110 who issued the voice command 106. The user profile may contain a hearing information data structure containing a plurality of user volume levels that the user 110 has acknowledged hearing in the past. The media guidance application may determine a lowest user volume level of the plurality of user volume levels. For example, the lowest volume level the user 110 has previously acknowledged hearing may be 40 dB. The second volume level (the volume level of the audible response) may be further based on the lowest user volume level. For example, the greatest volume level heard by any of the plurality of user devices (such as DeviceA 102, DeviceB 104, or DeviceC 114) may be 35 dB. In this example, the second volume level would be set at 40 dB to ensure that the user 110 is capable of hearing the audible response.

Figure 2:
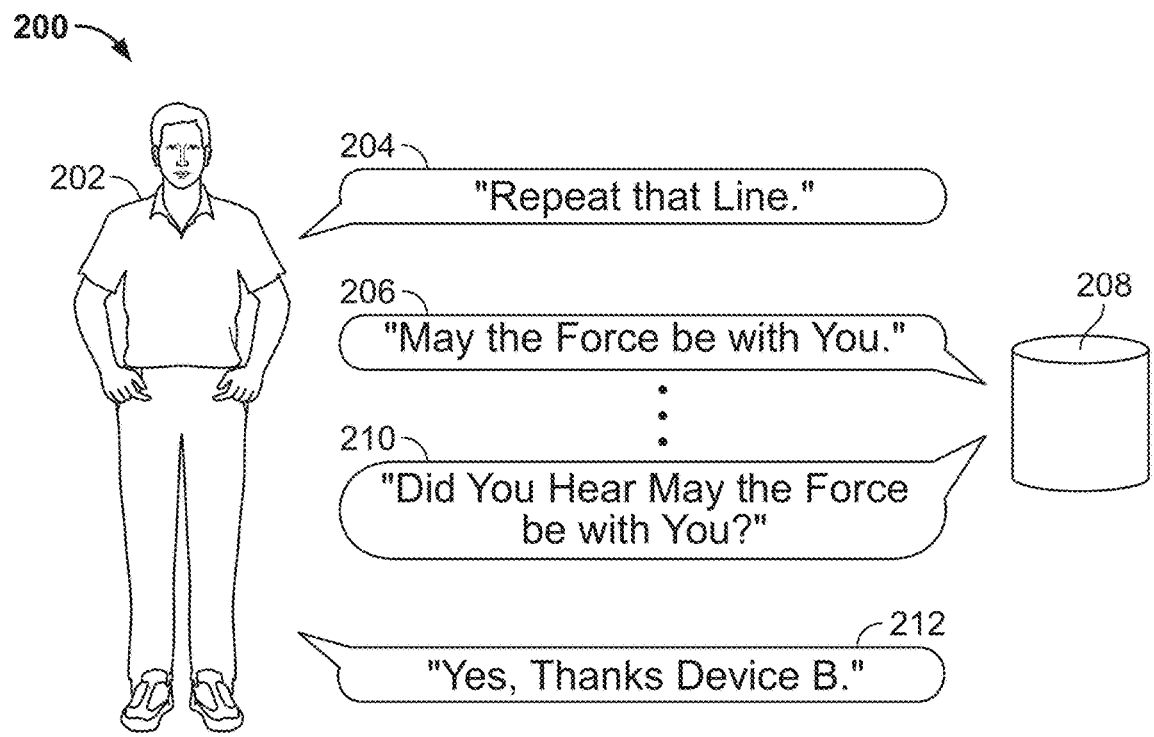
FIG. 2 shows an illustrative example of a media guidance application generating an audible response to a voice command through a voice-operated user device, in accordance with some embodiments of the disclosure.
Figure 3:
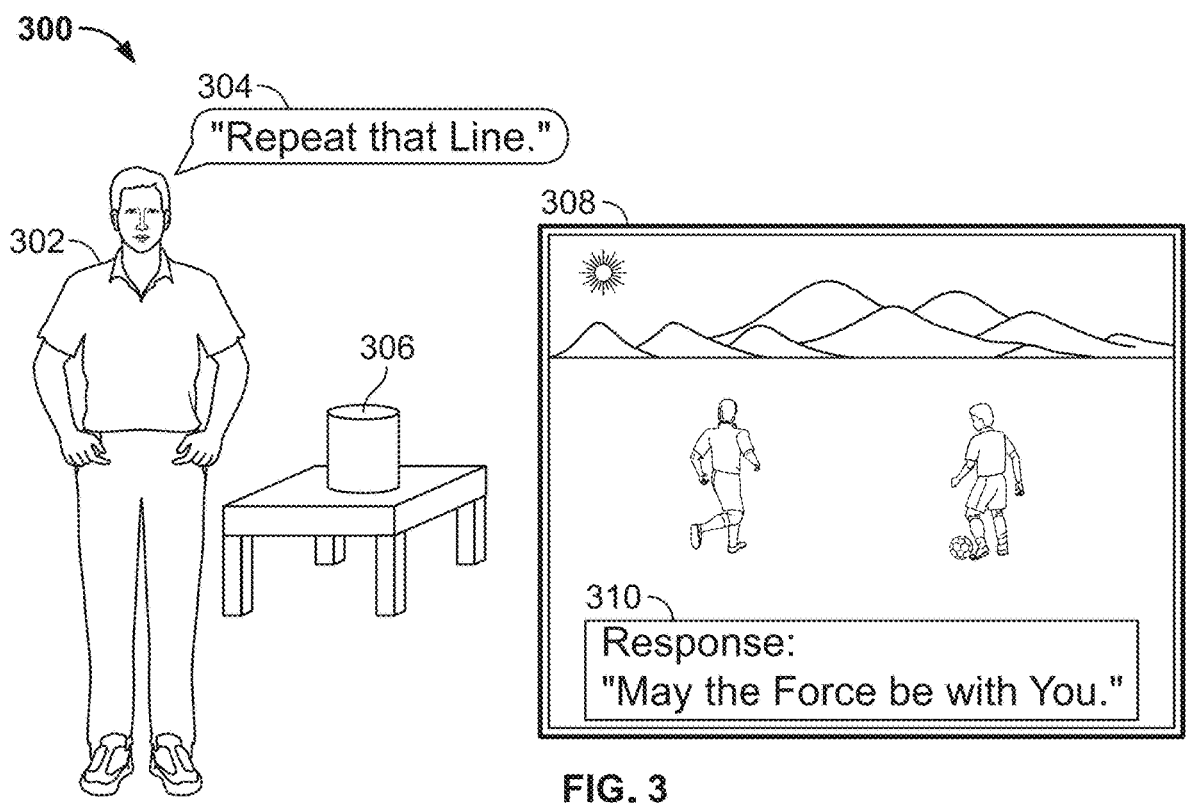
FIG. 3 shows an illustrative example of a media guidance application generating for display a visual representation of an audible response, in accordance with some embodiments of the disclosure.

FIG. 2 shows an illustrative example of a media guidance application generating an audible response 206 to a voice command 204 through a voice-operated user device 208, in accordance with some embodiments of the disclosure. In some embodiments, the media guidance application may wait a period of time for an acknowledgement that the user 202 has heard the audible response 206. If an acknowledgement is not received in that time, the media guidance application may generate a second audible response 210 to the voice command 204 through the second voice-operated user 208 device or may generate display a visual representation of the audible response to display on a user device, as shown in FIG. 3 and described below. To accomplish this, a media guidance application may determine a first time corresponding to when the audible response 206 was generated. For example, when the audible response 206 is generated, the media guidance application may save a time stamp to a data structure. For example, the audible response may have been generated at 3:12:03 PM. The media guidance application may then calculate a second time by adding a time period to the first time. For example, the time period may be 20 seconds and the second time may be 3:12:23 PM. This time period represents how long the media guidance application waits before again responding to the user's 202 voice command 204.

The time period for waiting for a user acknowledgement can be determined in a variety of ways. In some embodiments, the media guidance application may determine the time period by identifying a user profile associated with the user 202 and determining, using the user profile, an average time for response. For instance, the user profile may be identified by the media guidance application by receiving a key word spoken by the user 202, wherein the key word is associated with the specific user. The user profile may also be identified by the speech patterns of the user 202. The user profile may contain, for example, a first data structure containing amounts of time it has taken for the user 202 to respond to the voice-operated user device in the past. The media guidance application may calculate the average of these past response times to determine the average time for response for the user 202. For example, the user 202 may have taken 10 seconds, 5 seconds, and 15 seconds to respond to the second voice-operated user device 208 in the past. The time period to wait for response could be set to 10 seconds for this user, because 10 seconds is the average of the user's past response times.

In some embodiments, if the voice-operated user device 208 does not receive an acknowledgement from the user 202 within the time period, the media guidance application will generate another response 210 or repeat the original audible response 204 to the voice command. The acknowledgement 212 indicates the audible response was heard by the user. For example, the audible response 206 from the second voice-operated user device 208, such as DeviceB, may be "May the Force be with you." The user 202 may acknowledge this response by saying "Thanks DeviceB."

If no acknowledgement is received in a time period, a second audible response 210 or a visual representation of the audible response 206 may be generated. For example, in some embodiments, the media guidance application may transmit, based on whether an acknowledgement 212 was received at a third time, a visual representation (such as that shown in FIG. 3 in window 310) of the audio response to the display device (such as that shown in FIG. 3 at device 308) associated with the user, wherein the third time is before the second time. For example, the audible response 206 may have been generated at 3:12:03 PM. If the time period is 20 seconds, for example, the second time is 3:12:23 PM. If DeviceB has not received an acknowledgement by 3:12:23 PM, the media guidance application may generate, through the television associated with the user, the visual representation of the audible response 206 (e.g., "DeviceB said, '"May the Force be with you"'").

In some embodiments, if the voice-operated user device 208 does not receive an acknowledgement from the user within the time period, the media guidance application generates another audible response 210. Specifically, the media guidance application may generate, based on whether an acknowledgement (such as acknowledgement 212) was received at a third time, a second audible response 210 through the second voice-operated user device 208. The second audible response 210 can be the same as the audible response 204, in which case the second user simply repeats the audible response to the user at the same or a different volume level. The second audible response 210 may also, for example, prompt the user to respond. For example, if the second voice-operated user device 208 (e.g., DeviceB has not received an acknowledgement from the user by 3:12:23 PM, the media guidance application may generate through the second voice-operated user device 208 (e.g., DeviceB) the second audible response 210 asking "Did you hear '"May the Force be with you"'?"

The second audible response 210 may be generated at the same volume level as the first response or, in some embodiments, at a louder volume level. For example, the media guidance application may determine a third volume level that is greater than the second volume at which to generate the second audible response 210. The third volume level might be, for example, the second volume level plus a pre-determined amount. For example, the second volume level could be 53 dB, while the third volume level could be 56 dB. Because the second audible response 210 is generated at the third volume level, the media guidance application may generate the second audible response 210 (e.g., "Did you hear '"May the Force be with you"'?") through the second voice-operated device 208 (e.g., DeviceB) at 56 dB.

In some aspects, in order to best generate the second audible response 210, the media guidance application may identify a user profile associated with the user 202. For instance, the media guidance application may identify the user profile by receiving a key word spoken by the user 202. UserA may, for example, say "UserA" before issuing a voice command. The user profile may also be identified, for example, by the speech or vocal patterns of the user 202.

In some embodiments, the media guidance application may use the user profile to identify an average speaking volume associated with the user 202. For instance, the user profile may contain a first data structure containing speaking volumes the user has used in the past. The media guidance application may calculate the average of these past speaking volumes to determine the average speaking volume for the user 202. For example, the average speaking volume of the user may be 60 dB.

The media guidance application may then determine a difference between the average speaking volume level and the greatest volume level (i.e., the volume level received by the voice-operated user device 208 nearest the user 202). For example, the greatest volume level may be 52 dB and the average speaking volume of the user may be 60 dB. The difference, in this case, is 8 dB.

The third volume level (the volume level of the second audible response 210) may be based on the difference added to the second volume level. For example, the second volume level may be 53 dB, the difference may be 8 dB, and the third volume may be 61 dB. In this case, the second voice-operated user device 208 would issue the second audible response 210 at 61 dB.

In some examples, the media guidance application receives an acknowledgement 212 from the user. In response to receiving the acknowledgement 212, the media guidance application may store the second volume level (the volume level of the original audible response 206) in the user's user profile. For instance, the user profile may contain a hearing information data structure containing a plurality of user volume levels the user 202 has been able to hear in the past. The second volume level may be stored in this second data structure.

FIG. 3 shows an illustrative example of a media guidance application generating for display a visual representation of an audible response, in accordance with some embodiments of the disclosure. In some embodiments, the response to the voice command 304 from the user may be visually displayed on a display device 308. The media guidance application may identify a display device 308 associated with the user 302. For example, the media guidance application may interface with a television associated with the user 302 through a user profile. The media guidance application may generate for display a visual representation of the audible response. For example, the media guidance application may generate a window 310 on the television and may display the response in the window 310. For example, the media guidance application may display the last line from the movie the user 302 is watching, "May the Force be with you," when the request 304 from the user 302 that is received is a query about the last line in the movie. Furthermore, after the audible response is generated, the display window 310 may include a reference to the device 306 that gave the audible response. For example, the media guidance application may display "DeviceB said '"May the Force be with you.'"" This informs the user what device they are communicating with and, therefore, what device is near to them.

In some embodiments, the media guidance application may determine, using the user profile, the user 302 is hearing impaired. For example, this information could be stored in the hearing information data structure. For example, the user 302 may not be able to hear any audible response. In this case, similar to the description above, the media guidance application may identify a display device 308 associated with the user. The media guidance application may generate for display a visual representation of the audible response and transmit the visual representation to the display device 308 to display in window 310. For example, the media guidance application may transmit the visual representation to a television 308 associated with the user 302.

As used herein, a "continuous listening device" is a device that may, when powered on, be constantly monitoring audio without a user having to prompt (e.g., by pressing a button) the device to prepare for input commands. For example, a continuous listening device may be constantly monitoring audio for a keyword or prompt (e.g., "Hello Assistant") to activate an active listening state or may be constantly monitoring and processing all audio in a passive listening state. As used herein, a "passive listening state" is defined as a mode of operation of a continuous listening device in which the continuous listening device continues to temporarily or persistently record audio, but in which the user has not otherwise prompted the continuous listening device to prepare to receive instructions. In the passive state, the continuous listening device processes all audio input, as opposed to an active listening state, where audio is only processed in response to a keyword or prompt. In some embodiments, the continuous listening device stores audio received in a circular buffer that stores audio for a predetermined listening length. For example, the continuous listening device may store five minutes of audio, where the earliest audio information is deleted as new audio is recorded. In some embodiments, all audio is persistently stored, and may be deleted using routine housekeeping operations, or manually by a user.

As used herein, a "voice-operated user device" is a device that may constantly listen for audio input and keywords. When a keyword address to the device is detected, the voice-operated user device may process the audio input. A voice-operated user device may be referred to as a continuous listening device, as described above. A voice-operated user device may use a passive listening state or an active listening state. Some devices discussed above use a passive listening state and some may use an active listening state in any combination.

The amount of content available to users in any given content delivery system can be substantial. Consequently, many users desire a form of media guidance through an interface that allows users to efficiently navigate content selections and easily identify content that they may desire. An application that provides such guidance is referred to herein as an interactive media guidance application or, sometimes, a media guidance application or a guidance application.

Interactive media guidance applications may take various forms depending on the content for which they provide guidance. One typical type of media guidance application is an interactive television program guide. Interactive television program guides (sometimes referred to as electronic program guides) are well-known guidance applications that, among other things, allow users to navigate among and locate many types of content or media assets. Interactive media guidance applications may generate graphical user interface screens that enable a user to navigate among, locate and select content. As referred to herein, the terms "media asset" and "content" should be understood to mean an electronically consumable user asset, such as television programming, as well as pay-per-view programs, on-demand programs (as in video-on-demand (VOD) systems), Internet content (e.g., streaming content, downloadable content, Webcasts, etc.), video clips, audio, content information, pictures, rotating images, documents, playlists, websites, articles, books, electronic books, blogs, chat sessions, social media, applications, games, and/or any other media or multimedia and/or combination of the same. Guidance applications also allow users to navigate among and locate content. As referred to herein, the term "multimedia" should be understood to mean content that utilizes at least two different content forms described above, for example, text, audio, images, video, or interactivity content forms. Content may be recorded, played, displayed or accessed by user equipment devices, but can also be part of a live performance.

The media guidance application and/or any instructions for performing any of the embodiments discussed herein may be encoded on computer readable media. Computer readable media includes any media capable of storing data. The computer readable media may be transitory, including, but not limited to, propagating electrical or electromagnetic signals, or may be non-transitory including, but not limited to, volatile and non-volatile computer memory or storage devices such as a hard disk, floppy disk, USB drive, DVD, CD, media cards, register memory, processor caches, Random Access Memory ("RAM"), etc.

With the advent of the Internet, mobile computing, and high-speed wireless networks, users are accessing media on user equipment devices on which they traditionally did not. As referred to herein, the phrase "user equipment device," "user equipment," "user device," "electronic device," "electronic equipment," "media equipment device," or "media device" should be understood to mean any device for accessing the content described above, such as a television, a Smart TV, a set-top box, an integrated receiver decoder (IRD) for handling satellite television, a digital storage device, a digital media receiver (DMR), a digital media adapter (DMA), a streaming media device, a DVD player, a DVD recorder, a connected DVD, a local media server, a BLU-RAY player, a BLU-RAY recorder, a personal computer (PC), a laptop computer, a tablet computer, a WebTV box, a personal computer television (PC/TV), a PC media server, a PC media center, a hand-held computer, a stationary telephone, a personal digital assistant (PDA), a mobile telephone, a portable video player, a portable music player, a portable gaming machine, a smart phone, or any other television equipment, computing equipment, or wireless device, and/or combination of the same. In some embodiments, the user equipment device may have a front facing screen and a rear facing screen, multiple front screens, or multiple angled screens. In some embodiments, the user equipment device may have a front facing camera and/or a rear facing camera. On these user equipment devices, users may be able to navigate among and locate the same content available through a television. Consequently, media guidance may be available on these devices, as well. The guidance provided may be for content available only through a television, for content available only through one or more of other types of user equipment devices, or for content available both through a television and one or more of the other types of user equipment devices. The media guidance applications may be provided as on-line applications (i.e., provided on a web-site), or as stand-alone applications or clients on user equipment devices. Various devices and platforms that may implement media guidance applications are described in more detail below.

One of the functions of the media guidance application is to provide media guidance data to users. As referred to herein, the phrase "media guidance data" or "guidance data" should be understood to mean any data related to content or data used in operating the guidance application. For example, the guidance data may include program information, guidance application settings, user preferences, user profile information, media listings, media-related information (e.g., broadcast times, broadcast channels, titles, descriptions, ratings information (e.g., parental control ratings, critic's ratings, etc.), genre or category information, actor information, logo data for broadcasters' or providers' logos, etc.), media format (e.g., standard definition, high definition, 3D, etc.), on-demand information, blogs, websites, and any other type of guidance data that is helpful for a user to navigate among and locate desired content selections.

Figure 4:
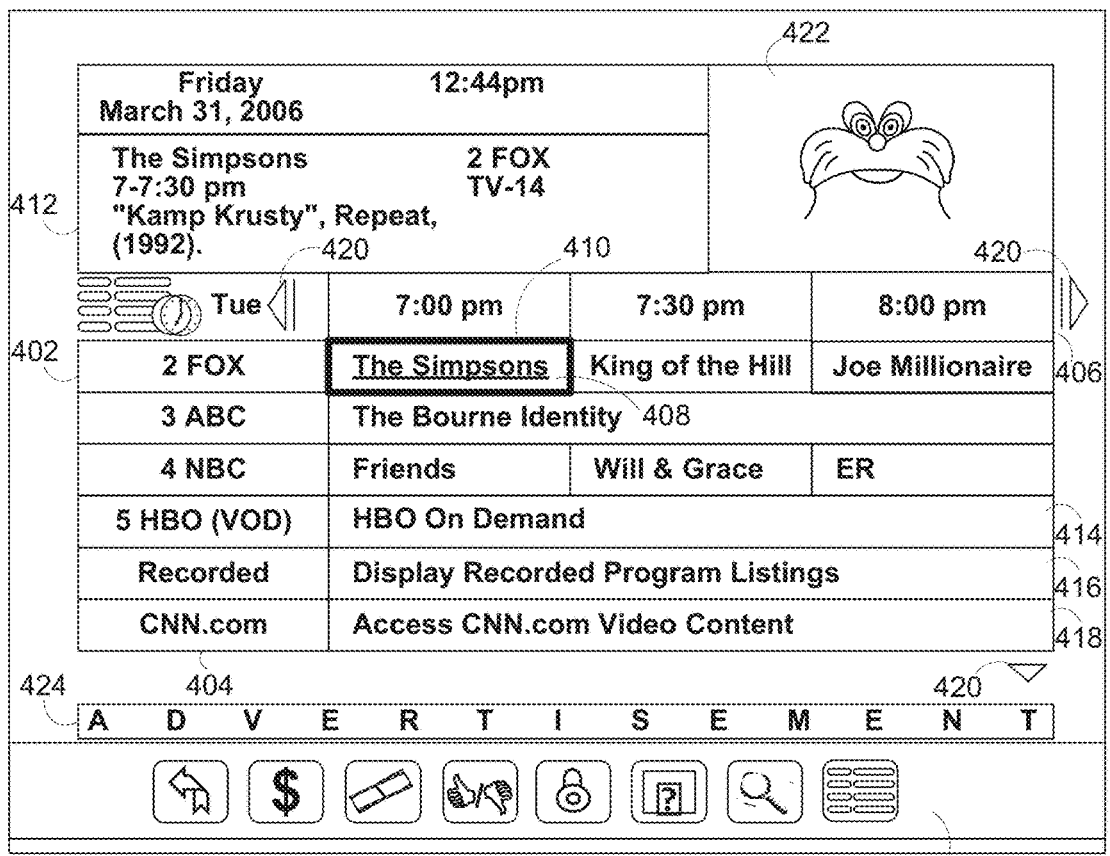
FIG. 4 shows an illustrative example of a display screen for use in accessing media content, in accordance with some embodiments of the disclosure.
Figure 5:
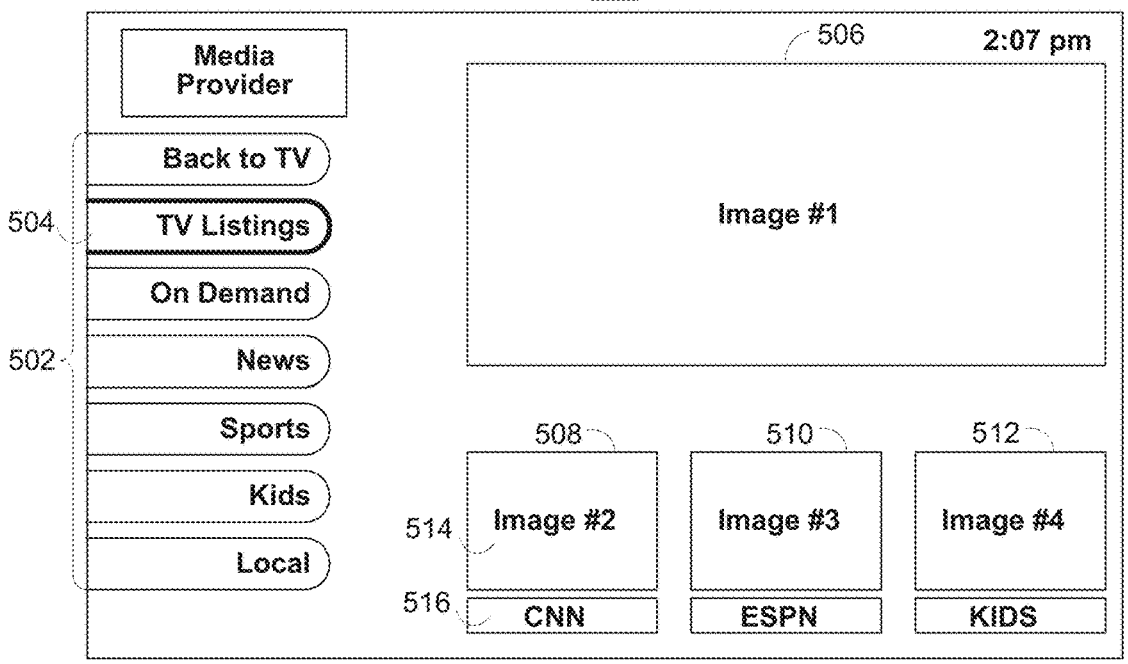
FIG. 5 shows another illustrative example of a display screen used in accessing media content, in accordance with some embodiments of the disclosure.

FIGS. 4-5 show illustrative display screens that may be used to provide media guidance data. The display screens shown in FIGS. 4-5 may be implemented on any suitable user equipment device or platform. While the displays of FIGS. 4-5 are illustrated as full screen displays, they may also be fully or partially overlaid over content being displayed. A user may indicate a desire to access content information by selecting a selectable option provided in a display screen (e.g., a menu option, a listings option, an icon, a hyperlink, etc.) or pressing a dedicated button (e.g., a GUIDE button) on a remote control or other user input interface or device. In response to the user's indication, the media guidance application may provide a display screen with media guidance data organized in one of several ways, such as by time and channel in a grid, by time, by channel, by source, by content type, by category (e.g., movies, sports, news, children, or other categories of programming), or other predefined, user-defined, or other organization criteria.

FIG. 4 shows illustrative grid of a program listings display 400 arranged by time and channel that also enables access to different types of content in a single display. Display 400 may include grid 402 with: (1) a column of channel/content type identifiers 404, where each channel/content type identifier (which is a cell in the column) identifies a different channel or content type available; and (2) a row of time identifiers 406, where each time identifier (which is a cell in the row) identifies a time block of programming. Grid 402 also includes cells of program listings, such as program listing 408, where each listing provides the title of the program provided on the listing's associated channel and time. With a user input device, a user can select program listings by moving highlight region 410. Information relating to the program listing selected by highlight region 410 may be provided in program information region 412. Region 412 may include, for example, the program title, the program description, the time the program is provided (if applicable), the channel the program is on (if applicable), the program's rating, and other desired information.

In addition to providing access to linear programming (e.g., content that is scheduled to be transmitted to a plurality of user equipment devices at a predetermined time and is provided according to a schedule), the media guidance application also provides access to non-linear programming (e.g, content accessible to a user equipment device at any time and is not provided according to a schedule). Non-linear programming may include content from different content sources including on-demand content (e.g., VOD), Internet content (e.g., streaming media, downloadable media, etc.), locally stored content (e.g., content stored on any user equipment device described above or other storage device), or other time-independent content. On-demand content may include movies or any other content provided by a particular content provider (e.g., HBO On Demand providing "The Sopranos" and "Curb Your Enthusiasm"). HBO ON DEMAND is a service mark owned by Time Warner Company L.P. et al. and THE SOPRANOS and CURB YOUR ENTHUSIASM are trademarks owned by the Home Box Office, Inc. Internet content may include web events, such as a chat session or Webcast, or content available on-demand as streaming content or downloadable content through an Internet web site or other Internet access (e.g., FTP).

Grid 402 may provide media guidance data for non-linear programming including on-demand listing 414, recorded content listing 416, and Internet content listing 418. A display combining media guidance data for content from different types of content sources is sometimes referred to as a "mixed-media" display. Various permutations of the types of media guidance data that may be displayed that are different than display 400 may be based on user selection or guidance application definition (e.g., a display of only recorded and broadcast listings, only on-demand and broadcast listings, etc.). As illustrated, listings 414, 416, and 418 are shown as spanning the entire time block displayed in grid 402 to indicate that selection of these listings may provide access to a display dedicated to on-demand listings, recorded listings, or Internet listings, respectively. In some embodiments, listings for these content types may be included directly in grid 402. Additional media guidance data may be displayed in response to the user selecting one of the navigational icons 420. (Pressing an arrow key on a user input device may affect the display in a similar manner as selecting navigational icons 420.)

Display 400 may also include video region 422, and options region 426. Video region 422 may allow the user to view and/or preview programs that are currently available, will be available, or were available to the user. The content of video region 422 may correspond to, or be independent from, one of the listings displayed in grid 402. Grid displays including a video region are sometimes referred to as picture-in-guide (PIG) displays. PIG displays and their functionalities are described in greater detail in Satterfield et al. U.S. Pat. No. 6,564,378, issued May 13, 2003 and Yuen et al. U.S. Pat. No. 6,239,794, issued May 29, 2001, which are hereby incorporated by reference herein in their entireties. PIG displays may be included in other media guidance application display screens of the embodiments described herein.

Options region 426 may allow the user to access different types of content, media guidance application displays, and/or media guidance application features. Options region 426 may be part of display 400 (and other display screens described herein), or may be invoked by a user by selecting an on-screen option or pressing a dedicated or assignable button on a user input device. The selectable options within options region 426 may concern features related to program listings in grid 402 or may include options available from a main menu display. Features related to program listings may include searching for other air times or ways of receiving a program, recording a program, enabling series recording of a program, setting program and/or channel as a favorite, purchasing a program, or other features. Options available from a main menu display may include search options, VOD options, parental control options, Internet options, cloud-based options, device synchronization options, second screen device options, options to access various types of media guidance data displays, options to subscribe to a premium service, options to edit a user's profile, options to access a browse overlay, or other options.

The media guidance application may be personalized based on a user's preferences. A personalized media guidance application allows a user to customize displays and features to create a personalized "experience" with the media guidance application. This personalized experience may be created by allowing a user to input these customizations and/or by the media guidance application monitoring user activity to determine various user preferences. Users may access their personalized guidance application by logging in or otherwise identifying themselves to the guidance application. Customization of the media guidance application may be made in accordance with a user profile. The customizations may include varying presentation schemes (e.g., color scheme of displays, font size of text, etc.), aspects of content listings displayed (e.g., only HDTV or only 3D programming, user-specified broadcast channels based on favorite channel selections, re-ordering the display of channels, recommended content, etc.), desired recording features (e.g., recording or series recordings for particular users, recording quality, etc.), parental control settings, customized presentation of Internet content (e.g., presentation of social media content, e-mail, electronically delivered articles, etc.) and other desired customizations.

The media guidance application may allow a user to provide user profile information or may automatically compile user profile information. The media guidance application may, for example, monitor the content the user accesses and/or other interactions the user may have with the guidance application. Additionally, the media guidance application may obtain all or part of other user profiles that are related to a particular user (e.g., from other web sites on the Internet the user accesses, such as www.Tivo.com, from other media guidance applications the user accesses, from other interactive applications the user accesses, from another user equipment device of the user, etc.), and/or obtain information about the user from other sources that the media guidance application may access. As a result, a user can be provided with a unified guidance application experience across the user's different user equipment devices. This type of user experience is described in greater detail below in connection with FIG. 7. Additional personalized media guidance application features are described in greater detail in Ellis et al., U.S. Patent Application Publication No. 2005/0251827, filed Jul. 11, 2005, Boyer et al., U.S. Pat. No. 7,165,098, issued Jan. 16, 2007, and Ellis et al., U.S. Patent Application Publication No. 2002/0174430, filed Feb. 21, 2002, which are hereby incorporated by reference herein in their entireties.

Another display arrangement for providing media guidance is shown in FIG. 5. Video mosaic display 500 includes selectable options 502 for content information organized based on content type, genre, and/or other organization criteria. In display 500, television listings option 504 is selected, thus providing listings 506, 508, 510, and 512 as broadcast program listings. In display 500 the listings may provide graphical images including cover art, still images from the content, video clip previews, live video from the content, or other types of content that indicate to a user the content being described by the media guidance data in the listing. Each of the graphical listings may also be accompanied by text to provide further information about the content associated with the listing. For example, listing 508 may include more than one portion, including media portion 514 and text portion 516. Media portion 514 and/or text portion 516 may be selectable to view content in full-screen or to view information related to the content displayed in media portion 514 (e.g., to view listings for the channel that the video is displayed on).

The listings in display 500 are of different sizes (i.e., listing 506 is larger than listings 508, 510, and 512), but if desired, all the listings may be the same size. Listings may be of different sizes or graphically accentuated to indicate degrees of interest to the user or to emphasize certain content, as desired by the content provider or based on user preferences. Various systems and methods for graphically accentuating content listings are discussed in, for example, Yates, U.S. Patent Application Publication No. 2010/0153885, filed Nov. 12, 2009, which is hereby incorporated by reference herein in its entirety.

Figure 6:
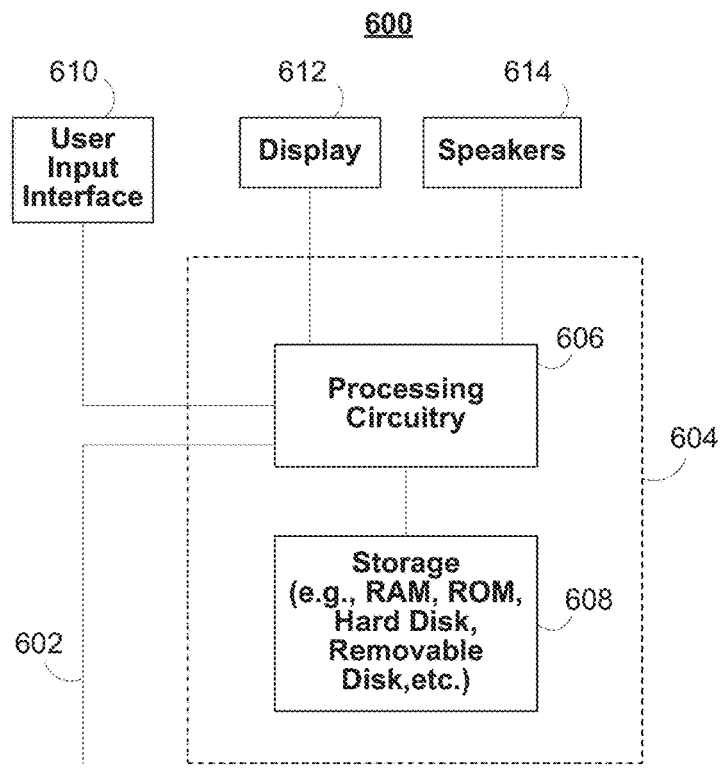
FIG. 6 is a block diagram of an illustrative user equipment device, in accordance with some embodiments of the disclosure.

Users may access content and the media guidance application (and its display screens described above and below) from one or more of their user equipment devices. FIG. 6 shows a generalized embodiment of illustrative user equipment device 600. More specific implementations of user equipment devices are discussed below in connection with FIG. 7. User equipment device 600 may receive content and data via input/output (hereinafter "I/O") path 602. I/O path 602 may provide content (e.g., broadcast programming, on-demand programming, Internet content, content available over a local area network (LAN) or wide area network (WAN), and/or other content) and data to control circuitry 604, which includes processing circuitry 606 and storage 608. Control circuitry 604 may be used to send and receive commands, requests, and other suitable data using I/O path 602. I/O path 602 may connect control circuitry 604 (and specifically processing circuitry 606) to one or more communications paths (described below). I/O functions may be provided by one or more of these communications paths, but are shown as a single path in FIG. 6 to avoid overcomplicating the drawing.

Control circuitry 604 may be based on any suitable processing circuitry such as processing circuitry 606. As referred to herein, processing circuitry should be understood to mean circuitry based on one or more microprocessors, microcontrollers, digital signal processors, programmable logic devices, field-programmable gate arrays (FPGAs), application-specific integrated circuits (ASICs), etc., and may include a multi-core processor (e.g., dual-core, quad-core, hexa-core, or any suitable number of cores) or supercomputer. In some embodiments, processing circuitry may be distributed across multiple separate processors or processing units, for example, multiple of the same type of processing units (e.g., two Intel Core i7 processors) or multiple different processors (e.g., an Intel Core i5 processor and an Intel Core i7 processor). In some embodiments, control circuitry 604 executes instructions for a media guidance application stored in memory (i.e., storage 608). Specifically, control circuitry 604 may be instructed by the media guidance application to perform the functions discussed above and below. For example, the media guidance application may provide instructions to control circuitry 604 to generate the media guidance displays. In some implementations, any action performed by control circuitry 604 may be based on instructions received from the media guidance application.

In client-server based embodiments, control circuitry 604 may include communications circuitry suitable for communicating with a guidance application server or other networks or servers. The instructions for carrying out the above mentioned functionality may be stored on the guidance application server. Communications circuitry may include a cable modem, an integrated services digital network (ISDN) modem, a digital subscriber line (DSL) modem, a telephone modem, Ethernet card, or a wireless modem for communications with other equipment, or any other suitable communications circuitry. Such communications may involve the Internet or any other suitable communications networks or paths (which is described in more detail in connection with FIG. 7). In addition, communications circuitry may include circuitry that enables peer-to-peer communication of user equipment devices, or communication of user equipment devices in locations remote from each other (described in more detail below).

Memory may be an electronic storage device provided as storage 608 that is part of control circuitry 604. As referred to herein, the phrase "electronic storage device" or "storage device" should be understood to mean any device for storing electronic data, computer software, or firmware, such as random-access memory, read-only memory, hard drives, optical drives, digital video disc (DVD) recorders, compact disc (CD) recorders, BLU-RAY disc (BD) recorders, BLU-RAY 3D disc recorders, digital video recorders (DVR, sometimes called a personal video recorder, or PVR), solid state devices, quantum storage devices, gaming consoles, gaming media, or any other suitable fixed or removable storage devices, and/or any combination of the same. Storage 608 may be used to store various types of content described herein as well as media guidance data described above. Nonvolatile memory may also be used (e.g., to launch a boot-up routine and other instructions). Cloud-based storage, described in relation to FIG. 7, may be used to supplement storage 608 or instead of storage 608.

Control circuitry 604 may include video generating circuitry and tuning circuitry, such as one or more analog tuners, one or more MPEG-2 decoders or other digital decoding circuitry, high-definition tuners, or any other suitable tuning or video circuits or combinations of such circuits. Encoding circuitry (e.g., for converting over-the-air, analog, or digital signals to MPEG signals for storage) may also be provided. Control circuitry 604 may also include scaler circuitry for upconverting and downconverting content into the preferred output format of the user equipment 600. Circuitry 604 may also include digital-to-analog converter circuitry and analog-to-digital converter circuitry for converting between digital and analog signals. The tuning and encoding circuitry may be used by the user equipment device to receive and to display, to play, or to record content. The tuning and encoding circuitry may also be used to receive guidance data. The circuitry described herein, including for example, the tuning, video generating, encoding, decoding, encrypting, decrypting, scaler, and analog/digital circuitry, may be implemented using software running on one or more general purpose or specialized processors. Multiple tuners may be provided to handle simultaneous tuning functions (e.g., watch and record functions, picture-in-picture (PIP) functions, multiple-tuner recording, etc.). If storage 608 is provided as a separate device from user equipment 600, the tuning and encoding circuitry (including multiple tuners) may be associated with storage 608.

A user may send instructions to control circuitry 604 using user input interface 610. User input interface 610 may be any suitable user interface, such as a remote control, mouse, trackball, keypad, keyboard, touch screen, touchpad, stylus input, joystick, voice recognition interface, or other user input interfaces. Display 612 may be provided as a stand-alone device or integrated with other elements of user equipment device 600. For example, display 612 may be a touchscreen or touch-sensitive display. In such circumstances, user input interface 610 may be integrated with or combined with display 612. Display 612 may be one or more of a monitor, a television, a liquid crystal display (LCD) for a mobile device, amorphous silicon display, low temperature poly silicon display, electronic ink display, electrophoretic display, active matrix display, electro-wetting display, electrofluidic display, cathode ray tube display, light-emitting diode display, electroluminescent display, plasma display panel, high-performance addressing display, thin-film transistor display, organic light-emitting diode display, surface-conduction electron-emitter display (SED), laser television, carbon nanotubes, quantum dot display, interferometric modulator display, or any other suitable equipment for displaying visual images. In some embodiments, display 612 may be HDTV-capable. In some embodiments, display 612 may be a 3D display, and the interactive media guidance application and any suitable content may be displayed in 3D. A video card or graphics card may generate the output to the display 612. The video card may offer various functions such as accelerated rendering of 3D scenes and 2D graphics, MPEG-2/MPEG-4 decoding, TV output, or the ability to connect multiple monitors. The video card may be any processing circuitry described above in relation to control circuitry 604. The video card may be integrated with the control circuitry 604. Speakers 614 may be provided as integrated with other elements of user equipment device 600 or may be stand-alone units. The audio component of videos and other content displayed on display 612 may be played through speakers 614. In some embodiments, the audio may be distributed to a receiver (not shown), which processes and outputs the audio via speakers 614.

The guidance application may be implemented using any suitable architecture. For example, it may be a stand-alone application wholly-implemented on user equipment device 600. In such an approach, instructions of the application are stored locally (e.g., in storage 608), and data for use by the application is downloaded on a periodic basis (e.g., from an out-of-band feed, from an Internet resource, or using another suitable approach). Control circuitry 604 may retrieve instructions of the application from storage 608 and process the instructions to generate any of the displays discussed herein. Based on the processed instructions, control circuitry 604 may determine what action to perform when input is received from input interface 610. For example, movement of a cursor on a display up/down may be indicated by the processed instructions when input interface 610 indicates that an up/down button was selected.

In some embodiments, the media guidance application is a client-server based application. Data for use by a thick or thin client implemented on user equipment device 600 is retrieved on-demand by issuing requests to a server remote to the user equipment device 600. In one example of a client-server based guidance application, control circuitry 604 runs a web browser that interprets web pages provided by a remote server. For example, the remote server may store the instructions for the application in a storage device. The remote server may process the stored instructions using circuitry (e.g., control circuitry 604) and generate the displays discussed above and below. The client device may receive the displays generated by the remote server and may display the content of the displays locally on equipment device 600. This way, the processing of the instructions is performed remotely by the server while the resulting displays are provided locally on equipment device 600. Equipment device 600 may receive inputs from the user via input interface 610 and transmit those inputs to the remote server for processing and generating the corresponding displays. For example, equipment device 600 may transmit a communication to the remote server indicating that an up/down button was selected via input interface 610. The remote server may process instructions in accordance with that input and generate a display of the application corresponding to the input (e.g., a display that moves a cursor up/down). The generated display is then transmitted to equipment device 600 for presentation to the user.

In some embodiments, the media guidance application is downloaded and interpreted or otherwise run by an interpreter or virtual machine (run by control circuitry 604). In some embodiments, the guidance application may be encoded in the ETV Binary Interchange Format (EBIF), received by control circuitry 604 as part of a suitable feed, and interpreted by a user agent running on control circuitry 604. For example, the guidance application may be an EBIF application. In some embodiments, the guidance application may be defined by a series of JAVA-based files that are received and run by a local virtual machine or other suitable middleware executed by control circuitry 604. In some of such embodiments (e.g., those employing MPEG-2 or other digital media encoding schemes), the guidance application may be, for example, encoded and transmitted in an MPEG-2 object carousel with the MPEG audio and video packets of a program.

Figure 7:
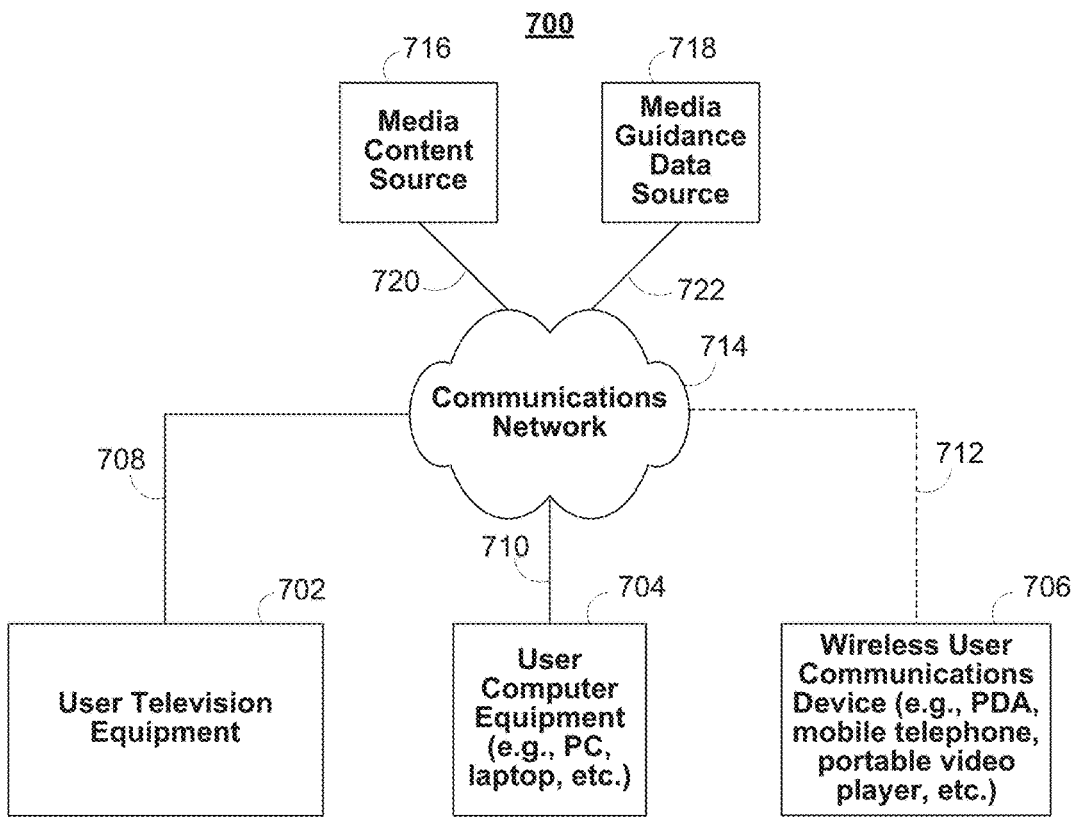
FIG. 7 is a block diagram of an illustrative media system, in accordance with some embodiments of the disclosure.

User equipment device 600 of FIG. 6 can be implemented in system 700 of FIG. 7 as user television equipment 702, user computer equipment 704, wireless user communications device 706, or any other type of user equipment suitable for accessing content, such as a non-portable gaming machine. For simplicity, these devices may be referred to herein collectively as user equipment or user equipment devices, and may be substantially similar to user equipment devices described above. User equipment devices, on which a media guidance application may be implemented, may function as a standalone device or may be part of a network of devices. Various network configurations of devices may be implemented and are discussed in more detail below.

A user equipment device utilizing at least some of the system features described above in connection with FIG. 6 may not be classified solely as user television equipment 702, user computer equipment 704, or a wireless user communications device 706. For example, user television equipment 702 may, like some user computer equipment 704, be Internet-enabled allowing for access to Internet content, while user computer equipment 704 may, like some television equipment 702, include a tuner allowing for access to television programming. The media guidance application may have the same layout on various different types of user equipment or may be tailored to the display capabilities of the user equipment. For example, on user computer equipment 704, the guidance application may be provided as a web site accessed by a web browser. In another example, the guidance application may be scaled down for wireless user communications devices 706.

In system 700, there is typically more than one of each type of user equipment device but only one of each is shown in FIG. 7 to avoid overcomplicating the drawing. In addition, each user may utilize more than one type of user equipment device and also more than one of each type of user equipment device.

In some embodiments, a user equipment device (e.g., user television equipment 702, user computer equipment 704, wireless user communications device 706) may be referred to as a "second screen device." For example, a second screen device may supplement content presented on a first user equipment device. The content presented on the second screen device may be any suitable content that supplements the content presented on the first device. In some embodiments, the second screen device provides an interface for adjusting settings and display preferences of the first device. In some embodiments, the second screen device is configured for interacting with other second screen devices or for interacting with a social network. The second screen device can be located in the same room as the first device, a different room from the first device but in the same house or building, or in a different building from the first device.

The user may also set various settings to maintain consistent media guidance application settings across in-home devices and remote devices. Settings include those described herein, as well as channel and program favorites, programming preferences that the guidance application utilizes to make programming recommendations, display preferences, and other desirable guidance settings. For example, if a user sets a channel as a favorite on, for example, the web site www.Tivo.com on their personal computer at their office, the same channel would appear as a favorite on the user's in-home devices (e.g., user television equipment and user computer equipment) as well as the user's mobile devices, if desired. Therefore, changes made on one user equipment device can change the guidance experience on another user equipment device, regardless of whether they are the same or a different type of user equipment device. In addition, the changes made may be based on settings input by a user, as well as user activity monitored by the guidance application.

The user equipment devices may be coupled to communications network 714. Namely, user television equipment 702, user computer equipment 704, and wireless user communications device 706 are coupled to communications network 714 via communications paths 708, 710, and 712, respectively. Communications network 714 may be one or more networks including the Internet, a mobile phone network, mobile voice or data network (e.g., a 4G or LTE network), cable network, public switched telephone network, or other types of communications network or combinations of communications networks. Paths 708, 710, and 712 may separately or together include one or more communications paths, such as, a satellite path, a fiber-optic path, a cable path, a path that supports Internet communications (e.g., IPTV), free-space connections (e.g., for broadcast or other wireless signals), or any other suitable wired or wireless communications path or combination of such paths. Path 712 is drawn with dotted lines to indicate that in the exemplary embodiment shown in FIG. 7 it is a wireless path and paths 708 and 710 are drawn as solid lines to indicate they are wired paths (although these paths may be wireless paths, if desired). Communications with the user equipment devices may be provided by one or more of these communications paths, but are shown as a single path in FIG. 7 to avoid overcomplicating the drawing.

Although communications paths are not drawn between user equipment devices, these devices may communicate directly with each other via communication paths, such as those described above in connection with paths 708, 710, and 712, as well as other short-range point-to-point communication paths, such as USB cables, IEEE 1394 cables, wireless paths (e.g., Bluetooth, infrared, IEEE 802-11x, etc.), or other short-range communication via wired or wireless paths. BLUETOOTH is a certification mark owned by Bluetooth SIG, INC. The user equipment devices may also communicate with each other directly through an indirect path via communications network 714.

System 700 includes content source 716 and media guidance data source 718 coupled to communications network 714 via communication paths 720 and 722, respectively. Paths 720 and 722 may include any of the communication paths described above in connection with paths 708, 710, and 712. Communications with the content source 716 and media guidance data source 718 may be exchanged over one or more communications paths, but are shown as a single path in FIG. 7 to avoid overcomplicating the drawing. In addition, there may be more than one of each of content source 716 and media guidance data source 718, but only one of each is shown in FIG. 7 to avoid overcomplicating the drawing. (The different types of each of these sources are discussed below.) If desired, content source 716 and media guidance data source 718 may be integrated as one source device. Although communications between sources 716 and 718 with user equipment devices 702, 704, and 706 are shown as through communications network 714, in some embodiments, sources 716 and 718 may communicate directly with user equipment devices 702, 704, and 706 via communication paths (not shown) such as those described above in connection with paths 708, 710, and 712.

System 700 may also include an advertisement source 724 coupled to communications network 714 via a communications path 726. Path 726 may include any of the communication paths described above in connection with paths 708, 710, and 712. Advertisement source 724 may include advertisement logic to determine which advertisements to transmit to specific users and under which circumstances. For example, a cable operator may have the right to insert advertisements during specific time slots on specific channels. Thus, advertisement source 724 may transmit advertisements to users during those time slots. As another example, advertisement source may target advertisements based on the demographics of users known to view a particular show (e.g., teenagers viewing a reality show). As yet another example, advertisement source may provide different advertisements depending on the location of the user equipment viewing a media asset (e.g., east coast or west coast).

In some embodiments, advertisement source 724 may be configured to maintain user information including advertisement-suitability scores associated with user in order to provide targeted advertising. Additionally or alternatively, a server associated with advertisement source 724 may be configured to store raw information that may be used to derive advertisement-suitability scores. In some embodiments, advertisement source 724 may transmit a request to another device for the raw information and calculate the advertisement-suitability scores. Advertisement source 724 may update advertisement-suitability scores for specific users (e.g., first subset, second subset, or third subset of users) and transmit an advertisement of the target product to appropriate users.

Content source 716 may include one or more types of content distribution equipment including a television distribution facility, cable system headend, satellite distribution facility, programming sources (e.g., television broadcasters, such as NBC, ABC, HBO, etc.), intermediate distribution facilities and/or servers, Internet providers, on-demand media servers, and other content providers. NBC is a trademark owned by the National Broadcasting Company, Inc., ABC is a trademark owned by the American Broadcasting Company, Inc., and HBO is a trademark owned by the Home Box Office, Inc. Content source 716 may be the originator of content (e.g., a television broadcaster, a Webcast provider, etc.) or may not be the originator of content (e.g., an on-demand content provider, an Internet provider of content of broadcast programs for downloading, etc.). Content source 716 may include cable sources, satellite providers, on-demand providers, Internet providers, over-the-top content providers, or other providers of content. Content source 716 may also include a remote media server used to store different types of content (including video content selected by a user), in a location remote from any of the user equipment devices. Systems and methods for remote storage of content, and providing remotely stored content to user equipment are discussed in greater detail in connection with Ellis et al., U.S. Pat. No. 7,761,892, issued Jul. 20, 2010, which is hereby incorporated by reference herein in its entirety.

Media guidance data source 718 may provide media guidance data, such as the media guidance data described above. Media guidance data may be provided to the user equipment devices using any suitable approach. In some embodiments, the guidance application may be a stand-alone interactive television program guide that receives program guide data via a data feed (e.g., a continuous feed or trickle feed). Program schedule data and other guidance data may be provided to the user equipment on a television channel sideband, using an in-band digital signal, using an out-of-band digital signal, or by any other suitable data transmission technique. Program schedule data and other media guidance data may be provided to user equipment on multiple analog or digital television channels.

In some embodiments, guidance data from media guidance data source 718 may be provided to users' equipment using a client-server approach. For example, a user equipment device may pull media guidance data from a server, or a server may push media guidance data to a user equipment device. In some embodiments, a guidance application client residing on the user's equipment may initiate sessions with source 718 to obtain guidance data when needed, e.g., when the guidance data is out of date or when the user equipment device receives a request from the user to receive data. Media guidance may be provided to the user equipment with any suitable frequency (e.g., continuously, daily, a user-specified period of time, a system-specified period of time, in response to a request from user equipment, etc.). Media guidance data source 718 may provide user equipment devices 702, 704, and 706 the media guidance application itself or software updates for the media guidance application.

In some embodiments, the media guidance data may include viewer data. For example, the viewer data may include current and/or historical user activity information (e.g., what content the user typically watches, what times of day the user watches content, whether the user interacts with a social network, at what times the user interacts with a social network to post information, what types of content the user typically watches (e.g., pay TV or free TV), mood, brain activity information, etc.). The media guidance data may also include subscription data. For example, the subscription data may identify to which sources or services a given user subscribes and/or to which sources or services the given user has previously subscribed but later terminated access (e.g., whether the user subscribes to premium channels, whether the user has added a premium level of services, whether the user has increased Internet speed). In some embodiments, the viewer data and/or the subscription data may identify patterns of a given user for a period of more than one year. The media guidance data may include a model (e.g., a survivor model) used for generating a score that indicates a likelihood a given user will terminate access to a service/source. For example, the media guidance application may process the viewer data with the subscription data using the model to generate a value or score that indicates a likelihood of whether the given user will terminate access to a particular service or source. In particular, a higher score may indicate a higher level of confidence that the user will terminate access to a particular service or source. Based on the score, the media guidance application may generate promotions that entice the user to keep the particular service or source indicated by the score as one to which the user will likely terminate access.

Media guidance applications may be, for example, stand-alone applications implemented on user equipment devices. For example, the media guidance application may be implemented as software or a set of executable instructions which may be stored in storage 608, and executed by control circuitry 604 of a user equipment device 600. In some embodiments, media guidance applications may be client-server applications where only a client application resides on the user equipment device, and server application resides on a remote server. For example, media guidance applications may be implemented partially as a client application on control circuitry 604 of user equipment device 600 and partially on a remote server as a server application (e.g., media guidance data source 718) running on control circuitry of the remote server. When executed by control circuitry of the remote server (such as media guidance data source 718), the media guidance application may instruct the control circuitry to generate the guidance application displays and transmit the generated displays to the user equipment devices. The server application may instruct the control circuitry of the media guidance data source 718 to transmit data for storage on the user equipment. The client application may instruct control circuitry of the receiving user equipment to generate the guidance application displays.

Content and/or media guidance data delivered to user equipment devices 702, 704, and 706 may be over-the-top (OTT) content. OTT content delivery allows Internet-enabled user devices, including any user equipment device described above, to receive content that is transferred over the Internet, including any content described above, in addition to content received over cable or satellite connections. OTT content is delivered via an Internet connection provided by an Internet service provider (ISP), but a third party distributes the content. The ISP may not be responsible for the viewing abilities, copyrights, or redistribution of the content, and may only transfer IP packets provided by the OTT content provider. Examples of OTT content providers include YOUTUBE, NETFLIX, and HULU, which provide audio and video via IP packets. Youtube is a trademark owned by Google Inc., Netflix is a trademark owned by Netflix Inc., and Hulu is a trademark owned by Hulu, LLC. OTT content providers may additionally or alternatively provide media guidance data described above. In addition to content and/or media guidance data, providers of OTT content can distribute media guidance applications (e.g., web-based applications or cloud-based applications), or the content can be displayed by media guidance applications stored on the user equipment device.

Media guidance system 700 is intended to illustrate a number of approaches, or network configurations, by which user equipment devices and sources of content and guidance data may communicate with each other for the purpose of accessing content and providing media guidance. The embodiments described herein may be applied in any one or a subset of these approaches, or in a system employing other approaches for delivering content and providing media guidance. The following four approaches provide specific illustrations of the generalized example of FIG. 7.

In one approach, user equipment devices may communicate with each other within a home network. User equipment devices can communicate with each other directly via short-range point-to-point communication schemes described above, via indirect paths through a hub or other similar device provided on a home network, or via communications network 714. Each of the multiple individuals in a single home may operate different user equipment devices on the home network. As a result, it may be desirable for various media guidance information or settings to be communicated between the different user equipment devices. For example, it may be desirable for users to maintain consistent media guidance application settings on different user equipment devices within a home network, as described in greater detail in Ellis et al., U.S. Patent Publication No. 2005/0251827, filed Jul. 11, 2005. Different types of user equipment devices in a home network may also communicate with each other to transmit content. For example, a user may transmit content from user computer equipment to a portable video player or portable music player.

In a second approach, users may have multiple types of user equipment by which they access content and obtain media guidance. For example, some users may have home networks that are accessed by in-home and mobile devices. Users may control in-home devices via a media guidance application implemented on a remote device. For example, users may access an online media guidance application on a website via a personal computer at their office, or a mobile device such as a PDA or web-enabled mobile telephone. The user may set various settings (e.g., recordings, reminders, or other settings) on the online guidance application to control the user's in-home equipment. The online guide may control the user's equipment directly, or by communicating with a media guidance application on the user's in-home equipment. Various systems and methods for user equipment devices communicating, where the user equipment devices are in locations remote from each other, is discussed in, for example, Ellis et al., U.S. Pat. No. 8,046,801, issued Oct. 25, 2011, which is hereby incorporated by reference herein in its entirety.

In a third approach, users of user equipment devices inside and outside a home can use their media guidance application to communicate directly with content source 716 to access content. Specifically, within a home, users of user television equipment 702 and user computer equipment 704 may access the media guidance application to navigate among and locate desirable content. Users may also access the media guidance application outside of the home using wireless user communications devices 706 to navigate among and locate desirable content.

In a fourth approach, user equipment devices may operate in a cloud computing environment to access cloud services. In a cloud computing environment, various types of computing services for content sharing, storage or distribution (e.g., video sharing sites or social networking sites) are provided by a collection of network-accessible computing and storage resources, referred to as "the cloud." For example, the cloud can include a collection of server computing devices, which may be located centrally or at distributed locations, that provide cloud-based services to various types of users and devices connected via a network such as the Internet via communications network 714. These cloud resources may include one or more content sources 716 and one or more media guidance data sources 718. In addition or in the alternative, the remote computing sites may include other user equipment devices, such as user television equipment 702, user computer equipment 704, and wireless user communications device 706. For example, the other user equipment devices may provide access to a stored copy of a video or a streamed video. In such embodiments, user equipment devices may operate in a peer-to-peer manner without communicating with a central server.

The cloud provides access to services, such as content storage, content sharing, or social networking services, among other examples, as well as access to any content described above, for user equipment devices. Services can be provided in the cloud through cloud computing service providers, or through other providers of online services. For example, the cloud-based services can include a content storage service, a content sharing site, a social networking site, or other services via which user-sourced content is distributed for viewing by others on connected devices. These cloud-based services may allow a user equipment device to store content to the cloud and to receive content from the cloud rather than storing content locally and accessing locally-stored content.

A user may use various content capture devices, such as camcorders, digital cameras with video mode, audio recorders, mobile phones, and handheld computing devices, to record content. The user can upload content to a content storage service on the cloud either directly, for example, from user computer equipment 704 or wireless user communications device 706 having content capture feature. Alternatively, the user can first transfer the content to a user equipment device, such as user computer equipment 704. The user equipment device storing the content uploads the content to the cloud using a data transmission service on communications network 714. In some embodiments, the user equipment device itself is a cloud resource, and other user equipment devices can access the content directly from the user equipment device on which the user stored the content.

Cloud resources may be accessed by a user equipment device using, for example, a web browser, a media guidance application, a desktop application, a mobile application, and/or any combination of access applications of the same. The user equipment device may be a cloud client that relies on cloud computing for application delivery, or the user equipment device may have some functionality without access to cloud resources. For example, some applications running on the user equipment device may be cloud applications, i.e., applications delivered as a service over the Internet, while other applications may be stored and run on the user equipment device. In some embodiments, a user device may receive content from multiple cloud resources simultaneously. For example, a user device can stream audio from one cloud resource while downloading content from a second cloud resource. Or a user device can download content from multiple cloud resources for more efficient downloading. In some embodiments, user equipment devices can use cloud resources for processing operations such as the processing operations performed by processing circuitry described in relation to FIG. 6.

As referred herein, the term "in response to" refers to initiated as a result of. For example, a first action being performed in response to a second action may include interstitial steps between the first action and the second action. As referred herein, the term "directly in response to" refers to caused by. For example, a first action being performed directly in response to a second action may not include interstitial steps between the first action and the second action.

Figure 8:
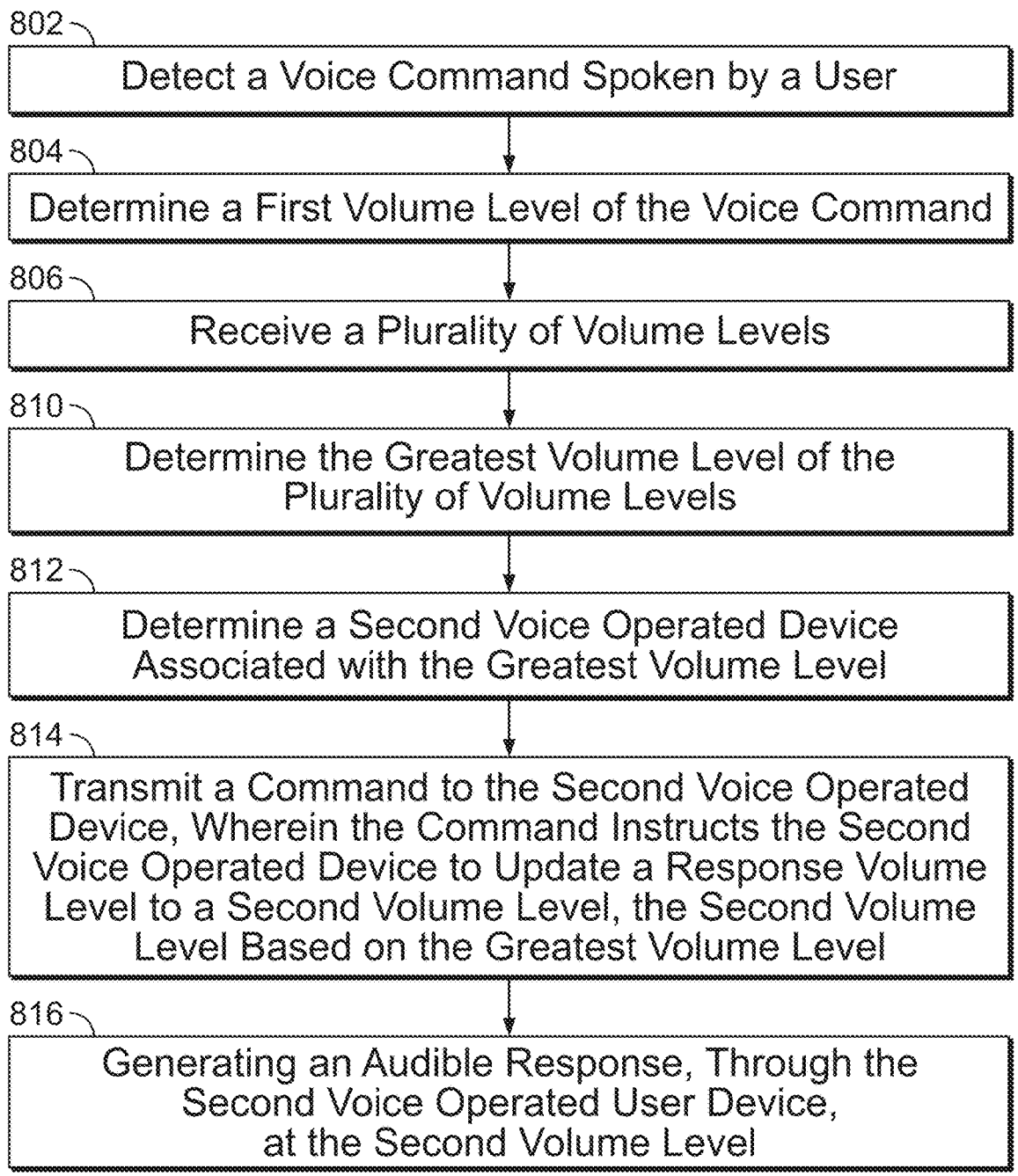
FIG. 8 is a flowchart of illustrative steps for generating an audible response through a voice-operated user device at a volume level based on the volume level of a user voice command, in accordance with some embodiments of the disclosure.

FIG. 8 is a flowchart of illustrative steps for generating an audible response through a voice-operated user device at a volume level based on the volume level of a voice command, in accordance with some embodiments of the disclosure. For example, a media guidance application may instruct control circuitry 604 to execute the elements of process 800.

Process 800 begins at 802, where the media guidance application detects (e.g., via control circuitry 604) a voice command spoken by a user. The media guidance application may detect the voice command through a first voice-operated user device of the plurality of voice-operated user devices. For example, the media guidance application may detect, through the voice-operated user DeviceA, a voice command from the user saying "Repeat the last line," in reference to a movie the user is currently watching, in a manner similar to that described above with respect to detecting, through the voice-operated user device 102, a voice command 106 from user 110 with regards to FIG. 1.

Process 800 continues to 804, where the media guidance application determines (e.g., via control circuitry 604) a first volume level of the voice command. This voice command is received, for example, by the voice-operated user device. For example, the first volume level may be the average of input volume of the voice command detected at the voice-operated user device in a manner similar to as described above with respect to detecting the volume level of voice command 106 at voice-operated user device 102 with regards to FIG. 1.

Process 800 continues to 808, where the media guidance application receives (e.g., via control circuitry 604) a plurality of volume levels. For example, several voice-operated user devices may detect the voice command from the user. Each of these devices could receive the voice command at a different volume level, depending on, for example, proximity to the user. Therefore, each voice-operated user device of a plurality of voice-operated user devices will be associated with a volume level of a plurality of volume levels of the voice command. The media guidance application may receive at least one data structure associating each volume level of the plurality of volume levels with a respective voice-operated user device of the plurality of voice-operated user devices. For example, the media guidance application may receive (e.g., via control circuitry 604), from each voice-operated user device of the plurality of voice-operated user devices, a data structure containing a volume level and a voice-operated user device identifier for the respective voice-operated user device. For example, the media guidance application may receive (e.g., via control circuitry 604) from a second voice-operated user device a data structure containing a volume level of 52 db and a device identifier DeviceB. For example, the media guidance application may receive (e.g., via control circuitry 604) from a third voice-operated user device a data structure containing a volume level of 50 db and a device identifier DeviceC.

Process 800 continues to 810, where the media guidance application determines (e.g., via control circuitry 604) the greatest volume level of the plurality of volume levels. In some embodiments, the media guidance application may compare the first volume level to the plurality of volume levels. For example, the media guidance application may compare 48 dB associated with DeviceA to 52 dB associated with DeviceB to 50 dB associated with DeviceC. In some embodiments, the media guidance application may determine (e.g., via control circuitry 604), based on comparing the first volume level to the plurality of volume levels, a greatest volume level of the plurality of volume levels. For example, the greatest volume level received by any of the plurality of voice-operated user devices may be 52 dB. The greatest volume level of the plurality of volume levels is the loudest of the volume levels received by the plurality of voice-operated user devices.

Process 800 continues to 812, where the media guidance application determines (e.g., via control circuitry 604) a second voice-operated device associated with the greatest volume level. In some embodiments, the media guidance application may search (e.g., via control circuitry 604) the at least one data structure for a second voice-operated user device associated with the greatest volume level. The user device associated with the greatest volume will be the device nearest to the user who issued the voice command, because the closer a device is to a user, the louder a voice command from that user will sound to the device. For example, if the greatest volume level is 52 dB, the media guidance application may search the data structure to find the voice-operated user device associated with 52 dB volume level. In the data structure, the 52 dB volume level may be associated with device identifier DeviceB, which represents the second voice-operated user device. DeviceB, in this example, is the nearest voice-operated user device to the user.

Process 800 continues to 814, where the media guidance application transmits (e.g., via communications network 714) a command to the second voice-operated device, wherein the command instructs the second voice-operated device to update a response volume level to a second volume level, the second volume level based on the greatest volume level. In some embodiments, the media guidance application may transmit a command to the second voice-operated user device. The command may instruct (e.g., via communications network 714) the second voice-operated user device to update a response level to a second volume level that is based on the greatest volume level. For example, the media guidance application may instruct the second voice-operated user device identified as DeviceB to change the response level to volume level 52 dB. For example, the media guidance application may instead instruct (e.g., via communications network 714) the second voice-operated user device identified as DeviceB to change the response level to 53 dB, which is slightly louder than the greatest volume level. The media guidance application may slightly increase the greatest volume level to determine the second volume in this manner to account for ambient noise.

Process 800 continues to 816, where the media guidance application generates (e.g., via control circuitry 604) an audible response, through the second voice-operated user device, at the second volume level. In some embodiments, the media guidance application may generate an audible response to the voice command. The audible response may be generated through the second voice-operated user device, at the second volume level. For example, the second voice-operated user device identified as DeviceB may repeat at volume level 53 dB the last line of the movie the user is currently watching (e.g., "May the Force be with you"). In some embodiments, the first and second voice-operated user devices may be the same device and the first volume level and the second volume may be the same volume level.

Figure 9:
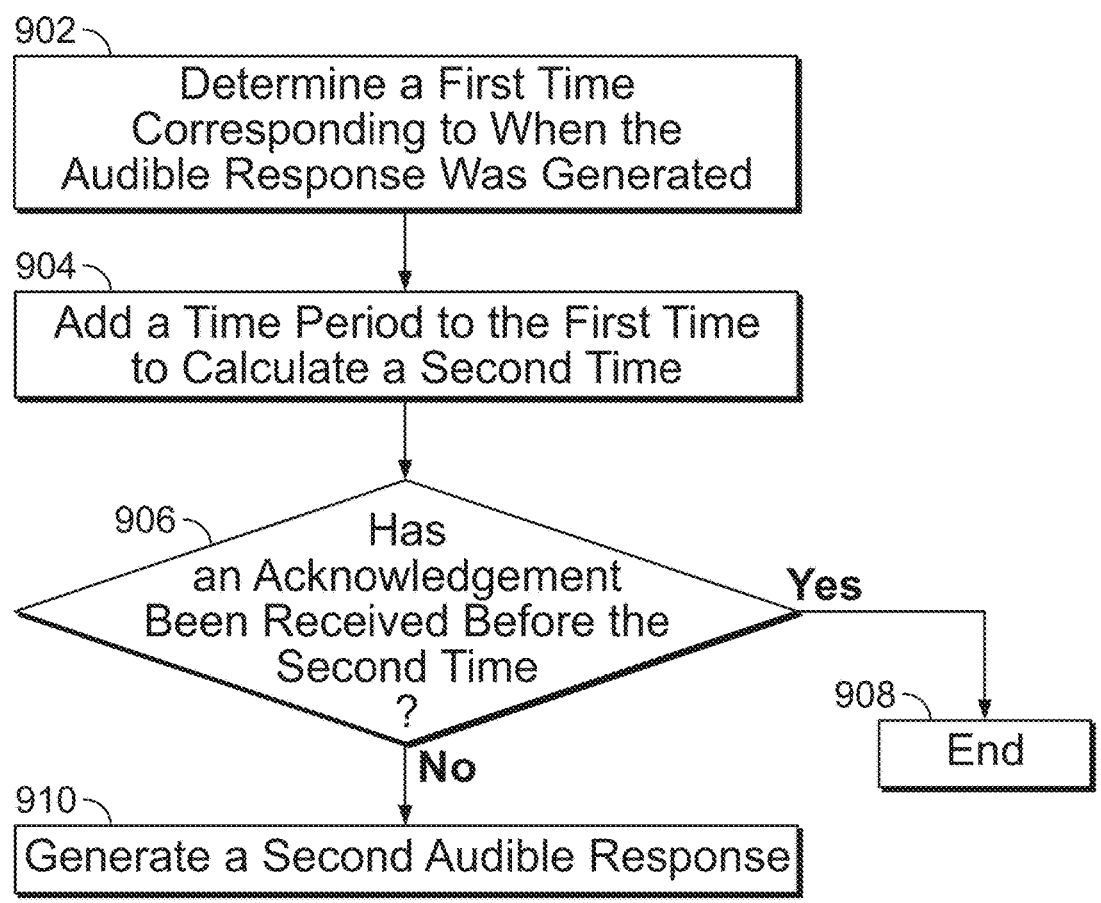
FIG. 9 is a flowchart of illustrative steps for generating a second audible response to a voice command if the audible response was not acknowledged by a user, in accordance with some embodiments of the disclosure.

FIG. 9 is a flowchart of illustrative steps for generating a second audible response to a voice command if the audible response was not acknowledged by a user, in accordance with some embodiments of the disclosure.

Process 900 begins at 902, where the media guidance application determines (e.g., via control circuitry 604) a first time corresponding to when the audible response was generated. For example, when the audible response is generated, the media guidance application may save (e.g., via control circuitry 604) a time stamp to a data structure (e.g., in storage 608). For example, the audible response may have been generated at 3:12:03 PM.

Process 900 continues to 904, where the media guidance application adds (e.g., via control circuitry 604) a time period to the first time to calculate a second time. For example, the time period may be 20 seconds. If the first time is 3:12:03 PM, the second time may then be 3:12:23 PM. The time period represents how long the media guidance application waits before again responding to the user's voice command.

Process 900 continues to 906, where the media guidance application determines (e.g., via control circuitry 604) whether an acknowledgement has been received before the second time. The acknowledgement indicates the audible response was heard by the user. For example, the audible response from the second voice-operated user device, such as DeviceB, may be "May the Force be with you." The user may acknowledge this response by saying "Thanks, DeviceB."

If the media guidance application determines an acknowledgement has been received before the second time, process 900 continues to 908, where the process 900 ends. If the media guidance application determines (e.g., via control circuitry 604) an acknowledgement has not been received before the second time, process 900 continues to 910, where the media guidance application may generate a second audible response. For example, the second audible response can be the same as the audible response, in which case the second user simply repeats the audible response to the user at the same or a different volume level. The second audible response may also, for example, prompt the user to respond. For example, if DeviceB has not received an acknowledgement from the user by 3:12:23 PM, the media guidance application may generate through DeviceB the second audible response asking "Did you hear 'May the Force be with you'?".

Figure 10:
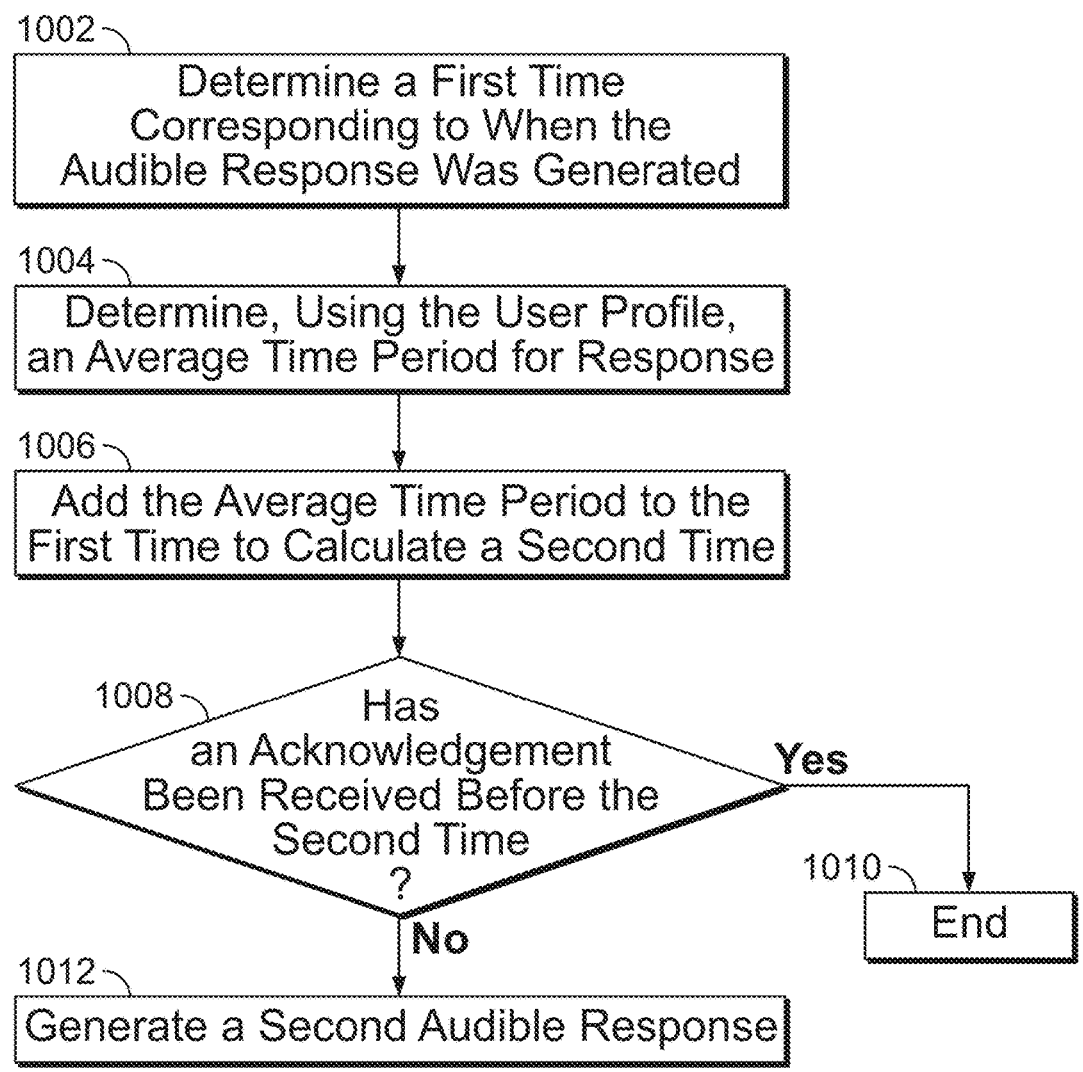
FIG. 10 is a flowchart of illustrative steps for generating a second audible response to a voice command if the audible response was not acknowledged by a user, in accordance with some embodiments of the disclosure.

FIG. 10 is a flowchart of illustrative steps for generating a second audible response to a voice command if the audible response was not acknowledged by a user, in accordance with some embodiments of the disclosure.

Process 1000 begins at 1002, where the media guidance application determines (e.g., via control circuitry 604) a first time corresponding to when the audible response was generated. For example, when the audible response is generated, the media guidance application may save (e.g., via control circuitry 604) a time stamp to a data structure (e.g., in storage 608). For example, the audible response may have been generated at 3:12:03 PM.

Process 1000 continues to 1004, where the media guidance application determines (e.g., via control circuitry 604), using a user profile, an average time period for response. The user profile may, for example, be accessed from a user profile database (e.g., a database stored in storage 608). For instance, the media guidance application may identify (e.g., via control circuitry 604) the user profile by receiving a key word spoken by the user, wherein the key word is associated with the specific user. The media guidance application may also identify (e.g., via control circuitry 604) the user profile by the speech patterns of the user. The user profile may contain, for example, a first data structure containing amounts of time it has taken for the user to respond to the voice-operated user device in the past. The media guidance application may calculate (e.g., via control circuitry 604) the average of these past response times to determine the average time for response for the user. For example, the user may have taken 10 seconds, 5 seconds, and 15 seconds to respond to the second voice-operated user device in the past. The time period to wait for response could be set to 10 seconds for this user, because 10 seconds is the average of the user's past response times.

Process 1000 continues to 1006, where the media guidance application adds (e.g., via control circuitry 604) the average time period to the first time to calculate a second time. For example, if average time period is 10 seconds and the first time is 3:12:03 PM, the second time is then be 3:12:13 PM.

Process 1000 continues to 1008, where the media guidance application determines (e.g., via control circuitry 604) whether an acknowledgement has been received before the second time. If the media guidance application determines an acknowledgement has been received before the second time, process 1000 continues to 1010, where the process 1000 ends. If the media guidance application determines an acknowledgement has not been received before the second time, process 1000 continues to 1012, where the media guidance application may generate (e.g., via control circuitry 604) a second audible response through the second voice-operated user device. For example, the second audible response can be the same as the audible response, in which case the second user simply repeats the audible response to the user at the same or a different volume level. The second audible response may also, for example, prompt the user to respond. For example, if DeviceB has not received an acknowledgement from the user by 3:12:23 PM, the media guidance application may generate through DeviceB the second audible response asking "Did you hear 'May the Force be with you'?"

Figure 11:
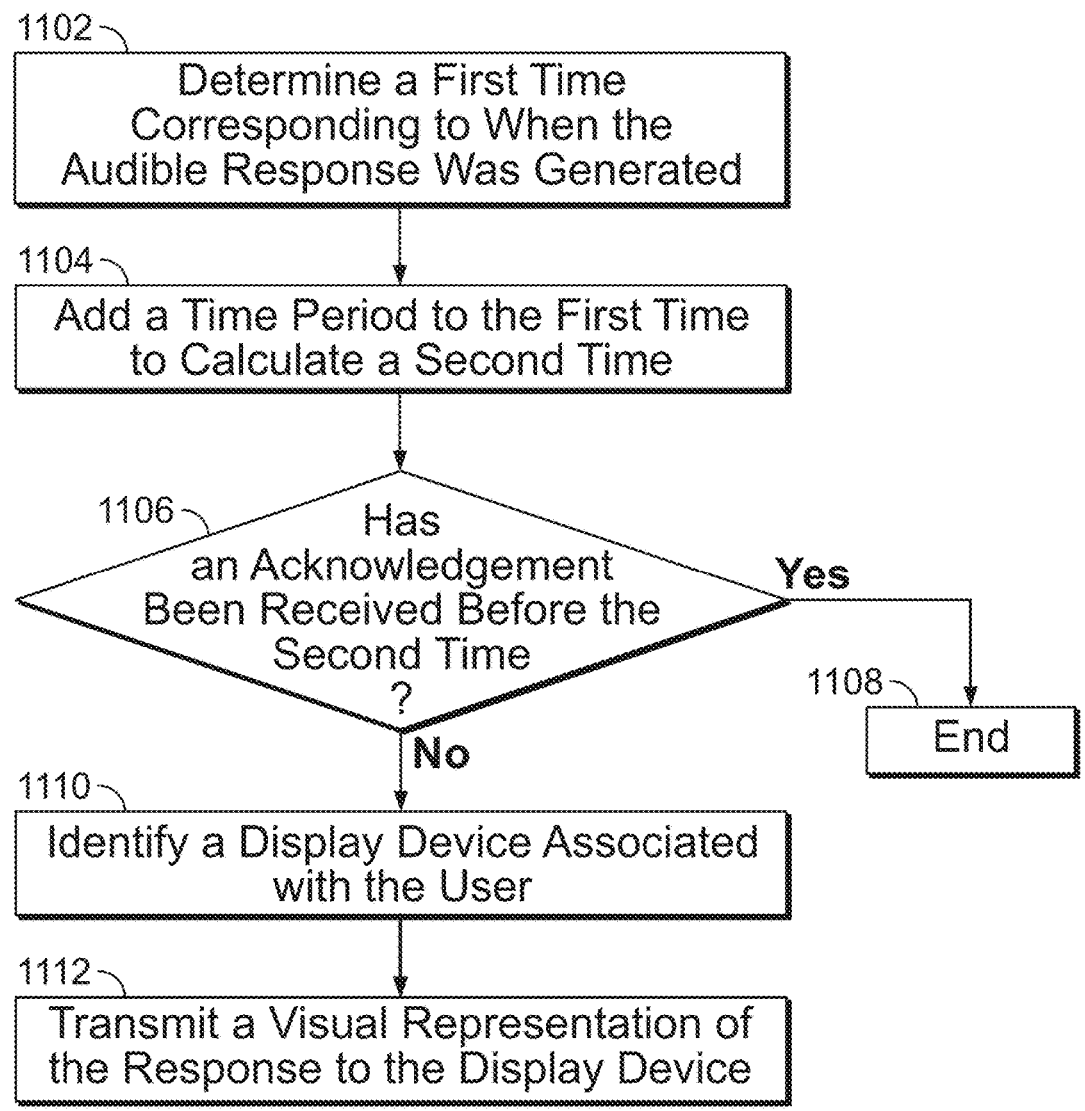
FIG. 11 is a flowchart of illustrative steps for transmitting a visual representation, to a display device, of a response to a voice command, in accordance with some embodiments of the disclosure.

FIG. 11 is a flowchart of illustrative steps for transmitting a visual representation of a response to a voice command to a display device, in accordance with some embodiments of the disclosure.

Process 1100 begins at 1102, where the media guidance application determines (e.g., via control circuitry 604) a first time corresponding to when the audible response was generated. For example, when the audible response is generated, the media guidance application may save (e.g., via control circuitry 604) a time stamp to a data structure (e.g., in storage 608). For example, the audible response may have been generated at 3:12:03 PM.

Process 1100 continues to 1104, where the media guidance application adds (e.g., via control circuitry 604) a time period to the first time to calculate a second time. For example, the time period may be 20 seconds. If the first time is 3:12:03 PM, the second time may then be 3:12:23 PM. The time period represents how long the media guidance application waits before again responding to the user's voice command.

Process 1100 continues to 1106, where the media guidance application determines (e.g., via control circuitry 604) whether an acknowledgement has been received before the second time. The acknowledgement indicates the audible response was heard by the user. For example, the audible response from the second voice-operated user device, such as DeviceB, may be "May the Force be with you." The user may acknowledge this response by saying "Thanks, DeviceB."

If the media guidance application determines an acknowledgement has been received before the second time, process 1100 continues to 1108, where the process 1100 ends. If the media guidance application determines an acknowledgement has not been received before the second time, process 1100 continues to 1110, where the media guidance application may identify (e.g., via control circuitry 604) a display device associated with the user. For example, the media guidance application may interface (e.g., via communications network 714) with a television associated with the user through a user profile. Process 1100 continues to 1112, where the media guidance application transmits (e.g., via communications network 714) a visual representation of the response to the display device. For example, the media guidance application may generate a window on the television and may display the response in the window. For example, the media guidance application may display the title of the program "Game of Thrones" when the request from the user that is received is a query about the name of the show. Furthermore, after the audible response is generated, the display window may include a reference to the device that gave the audible response. For example, the media guidance application may display "DeviceB said 'Game of Thrones.'" This informs the user what device they are communicating with and, therefore, what device is near to them.

Figure 12:
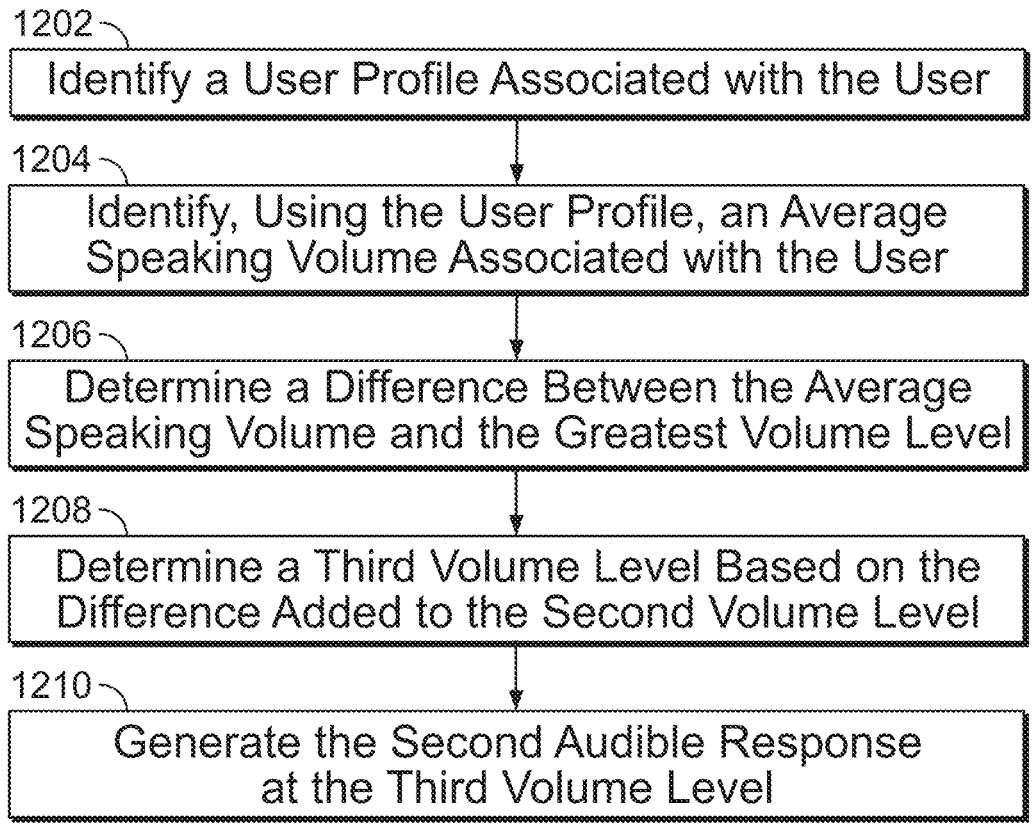
FIG. 12 is a flowchart of illustrative steps for generating a second audible response at a third volume level, in accordance with some embodiments of the disclosure.

FIG. 12 is a flowchart of illustrative steps for generating the second audible response at a third volume level, in accordance with some embodiments of the disclosure.

Process 1200 begins at 1202, where the media guidance application identifies (e.g., via control circuitry 604) a user profile associated with the user. For instance, the media guidance application may identify (e.g., via control circuitry 604) the user profile by receiving a key word spoken by the user. UserA may, for example, say "UserA" before issuing a voice command. The media guidance application may also identify (e.g., via control circuitry 604) the user profile, for example, by the speech or vocal patterns of the user.

Process 1200 continues to 1204, where the media guidance application identifies (e.g., via control circuitry 604) using the user profile, an average speaking volume associated with the user. For instance, the user profile may contain a first data structure containing speaking volumes the user has used in the past. The media guidance application may calculate (e.g., via control circuitry 604) the average of these past speaking volumes to determine the average speaking volume for the user. For example, the average speaking volume of the user may be 60 dB.

Process 1200 continues to 1206, where the media guidance application determines (e.g., via control circuitry 604) a difference between the average speaking volume and the greatest volume level (i.e., the volume level received by the voice-operated user device nearest the user). For example, the greatest volume level may be 52 dB and the average speaking volume of the user may be 60 dB. The difference, in this case, is 8 dB.

Process 1200 continues to 1206, where the media guidance application determines (e.g., via control circuitry 604) a third volume level based on the difference added to the second volume level. For example, the second volume level may be 53 dB and the difference may be 8 dB. The third volume may then be 61 dB.

Process 1200 continues to 1208, where the media guidance application generates (e.g., via control circuitry 604) the second audible response at the third volume level. For example, the third volume level may be 61 dB and the media guidance application may generate (e.g., via control circuitry 604) the second audible response at 61 dB, through the second voice-operated user device.

Figure 13:
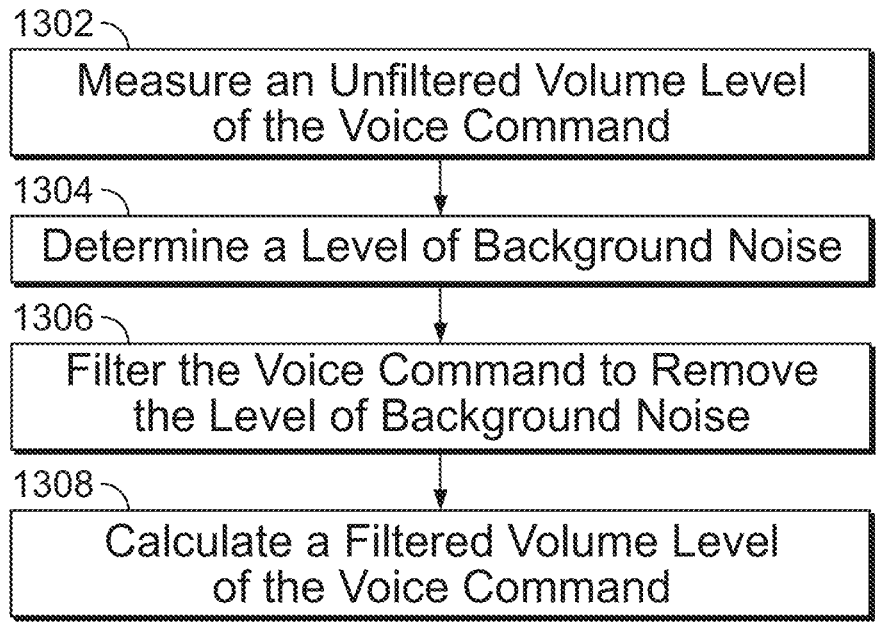
FIG. 13 is a flowchart of illustrative steps for filtering a voice command, in accordance with some embodiments of the disclosure.

FIG. 13 is a flowchart of illustrative steps for filtering a voice command, in accordance with some embodiments of the disclosure.

Process 1300 begins at 1302, where the media guidance application measures (e.g., via control circuitry 604) an unfiltered volume level of the voice command. For example, the unfiltered volume level of the voice command may be 60 dB. This unfiltered volume level, however, may include a level of background noise, such as a television audibly playing a movie near the user.

Process 1300 continues to 1304, where the media guidance application determines (e.g., via control circuitry 604) a level of background noise. For example, the movie playing on the television may be at a higher frequency than the voice of the user.

Process 1300 continues to 1306, where the media guidance application filters (e.g., via control circuitry 604) the voice command to remove the level of background noise. For example, the media guidance application may filter out (e.g., via control circuitry 604) the high frequency components of the voice command to remove the background noise.

Process 1300 continues to 1306, where the media guidance application calculates (e.g., via control circuitry 604) a filtered volume level of the voice command. For example, the filtered volume level of the voice command may be 48 dB, compared to the unfiltered volume level 60 dB.

What is claimed is:

1. A method comprising:
   detecting, through a plurality of voice-operated devices, a voice command spoken by a user;
   determining respective volume levels of the voice command at each voice-operated device of the plurality of voice-operated devices;

adjusting the respective volume levels based on respective sensitivities of the each voice-operated device of the plurality of voice-operated devices; and generating audible responses, through one or more voice-operated devices of the plurality of voice-operated devices, at volume levels corresponding to the adjusted respective volume levels of the voice command at the each voice-operated device of the plurality of voice-operated devices.

2. The method of claim 1, further comprising:

determining whether a particular volume level of the voice command at a particular voice-operated device corresponds to a whisper; and wherein generating a particular audible response through the particular voice-operated device comprises generating a whisper response.

3. The method of claim 1, further comprising receiving an acknowledgment from the user corresponding to the audible responses.

4. The method of claim 1, wherein determining an adjusted respective volume level of the voice command at a particular voice-operated device comprises:

measuring an unfiltered volume level of the voice command at the particular voice-operated device, wherein the unfiltered volume level is based on the adjusted respective volume level of the voice command at the particular voice-operated device;

determining a level of background noise;

filtering the voice command to remove the level of background noise;

calculating a filtered volume level of the voice command; and determining the adjusted respective volume level based on the filtered volume level.

5. The method of claim 1, wherein the determining the respective volume levels of the voice command at the each voice-operated device of the plurality of voice-operated devices further comprises:

for the each voice-operated device of the plurality of voice-operated devices:

determining a detected volume level of the voice command; and associating the detected volume level with a corresponding device identifier.

6. The method of claim 1, further comprising:

determining a first time corresponding to when the audible responses were generated;

calculating a second time, wherein the second time is the first time added to a time period;

identifying a display device associated with the user;

generating for display a visual representation of the audible responses; and transmitting, based on whether an acknowledgment was received at a third time, the visual representation to the display device, wherein the third time is before the second time.

7. The method of claim 1, wherein the user is a first user, the voice command is a first voice command, the respective volume levels are first respective volume levels, and the audible responses are first audible responses, the method further comprising:

detecting, through the plurality of voice-operated devices, a second voice command spoken by a second user;

determining second respective volume levels of the second voice command at the each voice-operated device of the plurality of voice-operated devices;

adjusting the second respective volume levels based on the respective sensitivities of the each voice-operated device of the plurality of voice-operated devices; and generating second audible responses to the second voice command through the each voice-operated device of the plurality of voice-operated devices corresponding to the adjusted second respective volume levels of the voice command at the each voice-operated device of the plurality of voice-operated devices.

8. The method of claim 1, wherein the generating the audible responses further includes not generating a response for the each voice-operated device having a determined respective volume level of zero.

9. The method of claim 1, wherein the generating the audible responses, through the one or more voice-operated devices of the plurality of voice-operated devices, further comprises:

determining a proximity of the user to the each voice-operated device of the plurality of voice-operated devices; and determining whether to generate an audible response at the each voice-operated device of the plurality of voice-operated devices based on the determined proximity.

10. The method of claim 1, wherein the user is a first user, and wherein the generating the audible responses, through the one or more voice-operated devices of the plurality of voice-operated devices, further comprises:

determining a proximity of persons other than the user to the each voice-operated device of the plurality of voice-operated devices; and determining whether to generate an audible response at the each voice-operated device of the plurality of voice-operated devices based on the determined proximity.

11. A system comprising:

control circuitry configured to:

detect, through a plurality of voice-operated devices, a voice command spoken by a user;

determine respective volume levels of the voice command at each voice-operated device of the plurality of voice-operated devices;

adjust the respective volume levels based on respective sensitivities of the each voice-operated device of the plurality of voice-operated devices; and generate audible responses, through one or more voice-operated devices of the plurality of voice-operated devices, at volume levels corresponding to the adjusted respective volume levels of the voice command at the each voice-operated device of the plurality of voice-operated devices.

12. The system of claim 11, wherein the control circuitry is further configured to:

determine whether a particular volume level of the voice command at a particular voice-operated device corresponds to a whisper; and generate a particular audible response through the particular voice-operated device by generating a whisper response.

13. The system of claim 11, wherein the control circuitry is further configured to receive an acknowledgment from the user corresponding to the audible responses.

14. The system of claim 11, wherein the control circuitry is further configured to, when determining an adjusted respective volume level of the voice command at a particular voice-operated device:

measure an unfiltered volume level of the voice command at the particular voice-operated device, wherein the unfiltered volume level is based on the adjusted respective volume level of the voice command at the particular voice-operated device;
determine a level of background noise;
filter the voice command to remove the level of background noise;
calculate a filtered volume level of the voice command; and
determine the adjusted respective volume level based on the filtered volume level.

15. The system of claim 11, wherein the control circuitry is further configured to, when determining the respective volume levels of the voice command at the each voice-operated device of the plurality of voice-operated devices:
for the each voice-operated device of the plurality of voice-operated devices:
determine a detected volume level of the voice command; and
associate the detected volume level with a corresponding device identifier.

16. The system of claim 11, wherein the control circuitry is further configured to:
determine a first time corresponding to when the audible responses were generated;
calculate a second time, wherein the second time is the first time added to a time period;
identify a display device associated with the user;
generate for display a visual representation of the audible responses; and
transmit, based on whether an acknowledgment was received at a third time, the visual representation to the display device, wherein the third time is before the second time.

17. The system of claim 11, wherein the user is a first user, the voice command is a first voice command, the respective volume levels are first respective volume levels, and the audible responses are first audible responses, and wherein the control circuitry is further configured to:
detect, through the plurality of voice-operated devices, a second voice command spoken by a second user;
determine second respective volume levels of the second voice command at the each voice-operated device of the plurality of voice-operated devices;
adjust the second respective volume levels based on the respective sensitivities of the each voice-operated device of the plurality of voice-operated devices; and
generate second audible responses to the second voice command through the each voice-operated device of the plurality of voice-operated devices corresponding to the adjusted second respective volume levels of the voice command at the each voice-operated device of the plurality of voice-operated devices.

18. The system of claim 11, wherein the generating the audible responses further includes not generating a response for the each voice-operated device having a determined respective volume level of zero.

19. The system of claim 11, wherein the control circuitry is further configured to, when generating the audible responses, through the one or more voice-operated devices of the plurality of voice-operated devices:
determine a proximity of the user to the each voice-operated device of the plurality of voice-operated devices; and
determine whether to generate an audible response at the each voice-operated device of the plurality of voice-operated devices based on the determined proximity.

20. The system of claim 11, wherein the user is a first user, and wherein the control circuitry is further configured to, when generating the audible responses, through the one or more voice-operated devices of the plurality of voice-operated devices:
determine a proximity of persons other than the user to the each voice-operated device of the plurality of voice-operated devices; and
determine whether to generate an audible response at the each voice-operated device of the plurality of voice-operated devices based on the determined proximity.

* * * * *